(12) United States Patent
Tsai et al.

(10) Patent No.: US 11,437,477 B1
(45) Date of Patent: Sep. 6, 2022

(54) FLUORINE-FREE INTERFACE FOR SEMICONDUCTOR DEVICE PERFORMANCE GAIN

(71) Applicant: Taiwan Semiconductor Manufacturing Company Limited, Hsinchu (TW)

(72) Inventors: Yu-Ting Tsai, New Taipei (TW); Chung-Liang Cheng, Changhua (TW); Hong-Ming Lo, Changhua (TW); Chun-Chih Lin, Taipei (TW); Chyi-Tsong Ni, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/225,835

(22) Filed: Apr. 8, 2021

(51) Int. Cl.
*H01L 21/82* (2006.01)
*H01L 29/417* (2006.01)
*H01L 29/40* (2006.01)
*H01L 29/49* (2006.01)
*H01L 29/423* (2006.01)
*H01L 29/45* (2006.01)

(52) U.S. Cl.
CPC ...... *H01L 29/41775* (2013.01); *H01L 29/401* (2013.01); *H01L 29/41733* (2013.01); *H01L 29/4236* (2013.01); *H01L 29/42384* (2013.01); *H01L 29/458* (2013.01); *H01L 29/4908* (2013.01)

(58) Field of Classification Search
None
See application file for complete search history.

(56) References Cited

U.S. PATENT DOCUMENTS

2016/0351563 A1\* 12/2016 Chen ............... H01L 29/518

\* cited by examiner

*Primary Examiner* — Moin M Rahman
(74) *Attorney, Agent, or Firm* — Harrity & Harrity, LLP

(57) ABSTRACT

A semiconductor may include an active region, an epitaxial source/drain formed in and extending above the active region, and a first dielectric layer formed over a portion of the active region. The semiconductor may include a first metal gate and a second metal gate formed in the first dielectric layer, a second dielectric layer formed over the first dielectric layer and the second metal gate, and a titanium layer, without an intervening fluorine residual layer, formed on the metal gate and the epitaxial source/drain. The semiconductor may include a first metal layer formed on top of the titanium layer on the first metal gate, a second metal layer formed on top of the titanium layer on the epitaxial source/drain, and a third dielectric layer formed on the second dielectric layer. The semiconductor may include first and second vias formed in the third dielectric layer.

20 Claims, 18 Drawing Sheets

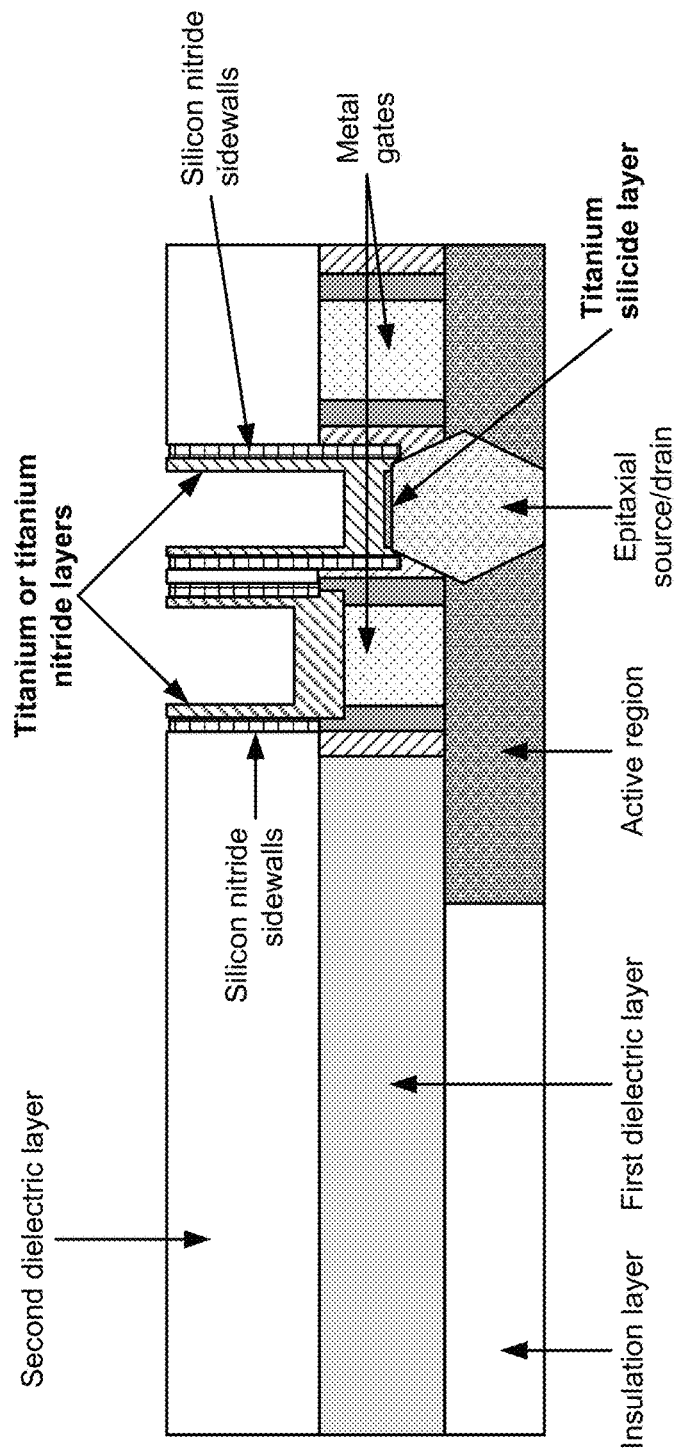

Form a titanium nitride layer on the second dielectric layer and on portions of the titanium or titanium nitride layers 225
Form photoresist layers on the titanium or titanium nitride layers formed on the bottoms of the trenches formed on the metal gate and the epitaxial source/drain

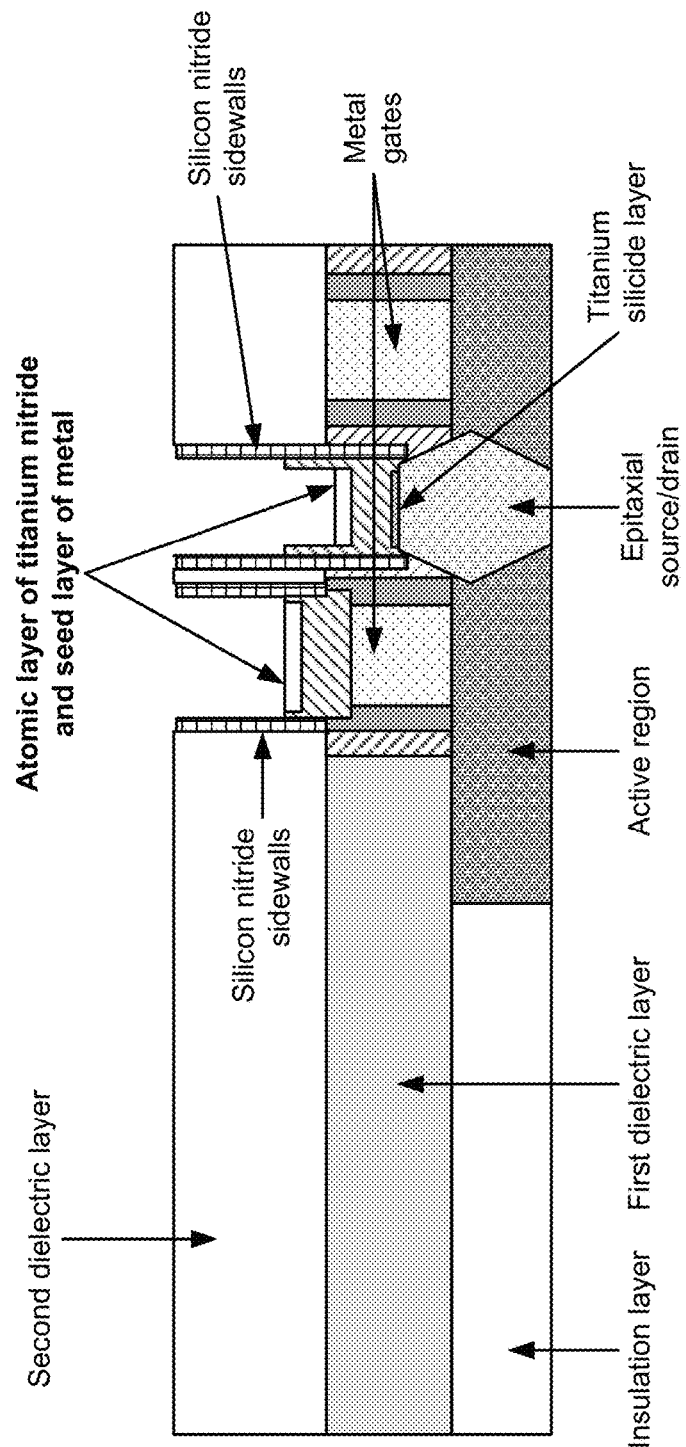

Polish the metal layer and the second dielectric layer to make the metal layer substantially planar with the second dielectric layer and to form a metal on polymer (MP) layer over the metal gate and a metal on an operation domain (MD) layer over the epitaxial source/drain

250

Form a third dielectric layer on the second dielectric layer, the MP layer, and the MD layer

255

Remove portions of the third dielectric layer to create a first via in the third dielectric layer on the MP layer and a second via in the third dielectric layer on the MD layer

260

Form a glue-free tungsten layer on the third dielectric layer and within the first via and the second via

265

Polish the glue-free tungsten layer and the third dielectric layer to make the glue-free tungsten layer substantially planar with the third dielectric layer and to form a first filled via on the MP layer and a second filled via on the MD layer

FLUORINE-FREE INTERFACE FOR SEMICONDUCTOR DEVICE PERFORMANCE GAIN

BACKGROUND

A logic device is an electronic device implementing a logical operation performed on one or more binary inputs that produces a single binary output. A logic device may include a multiplexer, a register, an arithmetic logic unit, a computer memory, a microprocessor, and/or the like. Some logic devices are made from metal-oxide-semiconductor field-effect transistors (MOSFETs). A static random-access memory (SRAM) is a type of semiconductor random-access memory device that uses bi-stable latching circuitry (e.g., a flip-flop) to store each bit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
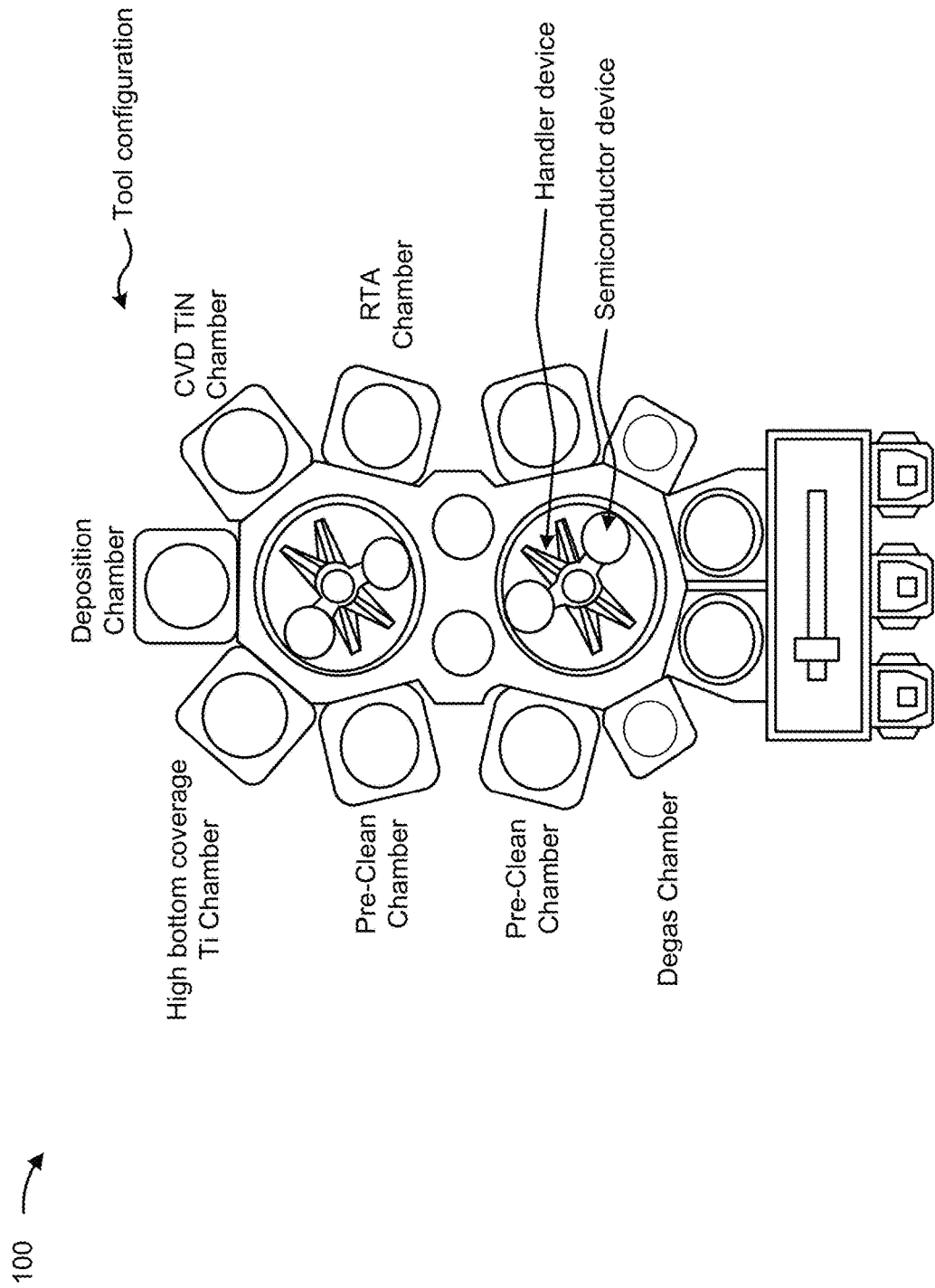
FIG. 1 is a diagram of an example implementation of semiconductor processing tools described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some instances, during manufacturing of a semiconductor device (e.g., a logic device or an SRAM), various pre-clean chambers may be used to remove oxide layers from sidewalls and bottoms of trenches formed on a metal gate and an epitaxial source/drain of the semiconductor device. After the oxide layers are removed, a metal silicide layer may be formed on the epitaxial source/drain to decrease contact resistance between the epitaxial source/drain and a metal layer of the semiconductor device. However, a pre-clean chamber (e.g., a Collins pre-clean chamber, a silicon cobalt nickel (SiCoNi) pre-clean chamber, and/or the like) may use a fluorine-based gas to remove the oxide layers, which may react with other chemicals and leave behind a residual fluorine layer between a metal on poly (MP) layer and the metal gate. The residual fluorine layer causes higher contact resistance between the MP layer and the metal gate, and the higher contact resistance degrades performance of the semiconductor device.

According to some implementations described herein, a method for manufacturing a semiconductor device (e.g., a logic device or an SRAM) is based on providing a fluorine-free interface between an MP layer and a metal gate for contact resistance reduction and metal resistance reduction. For example, the method may include removing oxide layers from sidewalls and bottoms of trenches formed on the metal gate and formed on an epitaxial source/drain of the semiconductor device. Since the removal of the oxide layers causes a fluorine residual layer to form on the metal gate, the method may include removing the fluorine residual layer using an in-situ high-temperature anneal process. Once the residual fluorine layer is removed, the method may include forming titanium or titanium nitride layers on the sidewalls and the bottoms of the trenches to cause a silicide layer to form on the epitaxial source/drain. The method may include forming a metal layer in the trenches and on top of the titanium or titanium nitride layers formed on the bottoms of the trenches, where the metal layer creates the MP layer over the metal gate and creates a metal on operation domain (MD) layer over an epitaxial source/drain. The method may include forming a dielectric layer on the MP layer and the MD layer, and removing portions of the dielectric layer to create a first via in the dielectric layer on the MP layer and to create a second via in the dielectric layer on the MD layer. The method may include filling the first via with a material to form a first filled via on the MP layer, and filling the second via with the material to form a second filled via on the MD layer.

The in-situ high-temperature anneal process may be performed using an in-situ high-temperature degas chamber to remove the fluorine residual layer. The in-situ high-temperature anneal process may include using the in-situ high-temperature degas chamber to heat the semiconductor device, which causes the fluorine residual layer to vaporize. In some implementations, the in-situ high temperature degas chamber may operate at a temperature of greater than or equal to three-hundred degrees Celsius (≥300° C.). Moreover, the in-situ high-temperature anneal process may include generating a vacuum in the in-situ high temperature degas chamber and using the vacuum to remove the vaporized fluorine residual layer from the in-situ high temperature degas chamber. In this way, the method for manufacturing a semiconductor device provides a fluorine-free interface between the MP layer and the metal gate, which reduces contact resistance, reduces metal resistance, and improves performance of the semiconductor device.

FIG. 1 is a diagram of an example implementation 100 of a tool configuration. In some implementations, the tool configuration may include one or more semiconductor processing chambers described herein. The tool configuration may be used to perform one or more processing techniques on a semiconductor device to form one or more layers of the semiconductor device, to remove portions of one or more layers of the semiconductor device, to prepare the semiconductor device for one or more processing layers, and/or the like.

As shown in FIG. 1, the one or more semiconductor processing chambers may include one or more pre-clean chambers, one or more degas chambers, one or more high bottom coverage titanium (Ti) chambers, one or more deposition chambers, one or more chemical vapor deposition (CVD) titanium nitride (TiN) chambers, one or more rapid thermal anneal (RTA) chambers, and/or the like.

The pre-clean chambers may include chambers that remove organic contaminants, ionic contamination, oxide layers, and/or the like from the semiconductor device. For example, the pre-clean chambers may remove organic contaminants from the semiconductor device using various combinations of gasses to remove oxides from various portions of the semiconductor device. An example pre-clean chamber includes a Collins pre-clean chamber. A Collins pre-clean chamber may be used to selectively remove native deep bottom oxide layers from the semiconductor device (e.g., to minimize loss of silicon and nickel) using a reaction gas that includes a combination of nitrogen trifluoride and ammonia ($NF_3+NH_3$). Another example pre-clean chamber includes a SiCoNi pre-clean chamber that includes an SiCoNi chamber that cleans the semiconductor device by selectively removing native bottom and side-wall oxides (e.g., to minimize loss of silicon and nickel) using a reaction gas that includes a combination of nitrogen trifluoride and ammonia ($NF_3+NH_3$). The SiCoNi chamber may provide a low-temperature, plasma-based pre-cleaning of the semiconductor device. The SiCoNi chamber may perform a one-step chemical process that removes oxidized silicon, from the semiconductor device, under high vacuum. The SiCoNi chamber may prepare a surface of the semiconductor device prior to formation of a layer (e.g., a silicide layer) to create an interface with minimal damage and reduced defects.

The degas chamber may include a chamber that performs an in-situ high-temperature anneal process on the semiconductor device to remove contaminants such as fluorine that are formed on the semiconductor device as a result of the gasses used in the pre-clean chambers. For example, a fluorine residual layer may form on a metal gate of the semiconductor device as a byproduct of the reaction between nitrogen trifluoride and ammonia in the pre-clean chambers. The degas chamber may include an in-situ high temperature degas chamber that operates under a vacuum. The degas chamber may remove the fluorine residual layer from the metal gate before formation of a metal on poly (MP) layer over the metal gate to provide a fluorine-free interface between the metal gate and the MP layer. The degas chamber may heat to a temperature of greater than or equal to three-hundred degrees Celsius to anneal the semiconductor device, which causes the fluorine residual layer to transition to a gaseous state. The degas chamber may use a vacuum formed therein to remove the gaseous fluorine residual layer from the degas chamber.

The high bottom coverage Ti chamber may include a chamber that forms metal (e.g., titanium) layers on the semiconductor device. In some implementations, the high bottom coverage Ti chamber includes a chamber that enables deposition of the metal layers on the semiconductor device. The chamber may be filled with a gas (e.g., an argon gas) that is maintained at or near room temperature and is provided at a particular flow rate (e.g., 20, 25, 30 and/or the like standard cubic centimeters per minute (sccm)). In some implementations, the high bottom coverage Ti chamber may include a heater component, a target component, and a magnetron that are provided within the chamber. The heater component may include a support pad that is sized and shaped to support the semiconductor device. The support pad may include one or more heating elements that generate heat that is transferred to the semiconductor device based on the semiconductor device contacting the support pad. The target component may include a material that is used to create metal layers on the semiconductor device, via a technique known as thin film deposition. For example, the target component may include a titanium material, an aluminum material, a copper material, an aluminum copper material, and/or the like. The magnetron may include multiple magnetic columns that generate a magnetic field when the magnetron is rotated.

In operation, since the magnetron is located behind the target component, plasma generated from the target component may be confined to a target surface of the semiconductor device. Rotation of the magnetron may generate a magnetic field that forms a closed-loop annular path acting as an electron trap that reshapes trajectories of secondary electrons ejected from the target component into a cycloidal path, which increases a probability of ionization of a sputtering gas within the chamber. Inert gases (e.g., argon) may be employed as the sputtering gas because inert gases tend not to react with the target component or combine with any process gases and because inert gases produce higher sputtering and deposition rates due to high molecular weight. Positively charged argon ions from the plasma may be accelerated toward the negatively biased target component, resulting in material being dislodged from a surface of the target component and onto the semiconductor device.

The deposition chamber may include a chamber that is used in the deposition of materials on the semiconductor device, such as an insulation layer, a dielectric layer, a mask layer, a metal layer, and/or the like. Deposition is any process that grows, coats, or otherwise transfers a material onto a semiconductor device. The deposition chamber may include a chamber for forming a thin film of material on a semiconductor device by physical vapor deposition (PVD), CVD, atomic layer deposition (ALD), molecular beam epitaxy (MBE), electrochemical deposition (ECD), and/or the like. In some implementations, the deposition chamber includes a chamber that enables deposition of layers on the semiconductor device. The chamber may be filled with a gas (e.g., an argon gas), is provided at a particular flow rate, is maintained at a particular pressure, and/or the like, depending on the material deposited on the semiconductor device.

The CVD TiN chamber may include a chamber that is used for deposition of materials on the semiconductor device, such as an insulation layer, a dielectric layer, a mask layer, a metal layer, and/or the like. The CVD TiN chamber may include a chamber that is used in the formation of a thin film of material on a semiconductor device by CVD, although the CVD TiN tool may be replaced with a PVD tool, an ALD tool, and/or the like. In some implementations, the CVD TiN chamber includes a chamber that enables deposition of layers on the semiconductor device. The chamber may be filled with a gas (e.g., an argon gas), is provided at a particular flow rate, is maintained at a particular pressure, and/or the like, depending on the material deposited on the semiconductor device.

The RTA chamber may include a chamber that is used to heat the semiconductor device to a high temperature (e.g., over 1000° C.,) in a short time period (e.g., several seconds or less) in order to affect electrical properties of the semiconductor device. For example, the RTA tool may heat the semiconductor device to activate dopants, change film-to-film or film-to-wafer interfaces, densify deposited films, change states of grown films, repair damage from ion implantation, move dopants or drive dopants from one film into another or from a film into the semiconductor device, and/or the like. The RTA chamber may be used to generate heat for the semiconductor device with lamp-based heating, lasers, a hot chuck, a hot plate, and/or the like.

A semiconductor device may be provided to and/or between one or more of the aforementioned chambers via a handler device (e.g., a robotic arm, multiple robotic arms, and/or the like). In some implementations, the tool configuration is used to produce a semiconductor device described below in connection with FIGS. 2A-5. The arrangement of the chambers in the tool configuration shown in FIG. 1 is for explanatory purposes. One or more of the chambers in the tool configuration may be differently arranged, one or more of the chambers may be spaced apart from other chambers (e.g., chambers may be spaced apart and the handler device may be a robot that transports a semiconductor device to and/or from the spaced-apart chambers), and/or the like. Moreover, the chambers included in the tool configuration illustrated in FIG. 1 may be used in conjunction with other semiconductor processing tools and/or chambers to further prepare and/or process a semiconductor device, such as an etch tool, a photoresist tool.

For example, an etch tool may be used to remove materials from a surface of a semiconductor device. In some implementations, a portion of the semiconductor device is protected from an etchant by a masking material that resists etching. For example, the masking material may include a photoresist that is patterned using photolithography. The etch tool may perform a wet etching process or a dry (e.g., plasma) etching process on the semiconductor device. In the wet etching process, the semiconductor device may be immersed in a batch of a liquid-phase (e.g., wet) etchant, which may be agitated to achieve process control. For example, a buffered hydrofluoric acid (BHF) may be used to etch silicon dioxide over a silicon substrate. The plasma etching process may operate in several modes based on adjusting parameters of the plasma. For example, the plasma etching process may operate at a pressure in a range from approximately 0.1 Torr to approximately 5 Torr. The plasma produces energetic free radicals, that are neutrally charged and that react at a surface of the semiconductor device. Plasma etching may be isotropic (e.g., exhibiting a lateral undercut rate on a patterned surface approximately the same as a downward etch rate) or anisotropic (e.g., exhibiting a smaller lateral undercut rate than the downward etch rate). A source gas for the plasma may include small molecules rich in chlorine or fluorine. For example, carbon tetrachloride may be used to etch silicon and aluminum, trifluoro methane may be used to etch silicon dioxide and silicon nitride, and/or the like. The plasma may also include oxygen that is used to oxidize photoresist and facilitate removal of the photoresist.

As another example, a photoresist tool may be used to remove materials from or provides materials to a semiconductor device based on a photoresist layer (e.g., a photoresist mask) applied to the semiconductor device. A photoresist is a light-sensitive material used in several processes (e.g., photolithography, photoengraving, and/or the like) to form a patterned coating on a surface of a semiconductor device. The photoresist tool may coat the semiconductor device with a photo-sensitive organic material, and may apply a patterned mask to the semiconductor device to block light, so that only unmasked regions of the photo-sensitive organic material will be exposed to light. The photoresist tool or another tool (e.g., an etch tool) may apply a solvent, called a developer, to the semiconductor device. In the case of a positive photoresist, the photo-sensitive organic material is degraded by light and the developer dissolves away regions that are exposed to light, leaving behind a coating where the mask is placed. In the case of a negative photoresist, the photo-sensitive organic material is strengthened (e.g., either polymerized or cross-linked) by light, and the developer dissolves away only regions that are not exposed to light, leaving behind a coating in areas where the mask is not placed.

As indicated above, FIG. 1 is provided merely as one or more examples. Other examples may differ from what is described with regard to FIG. 1.

Figure 2A:
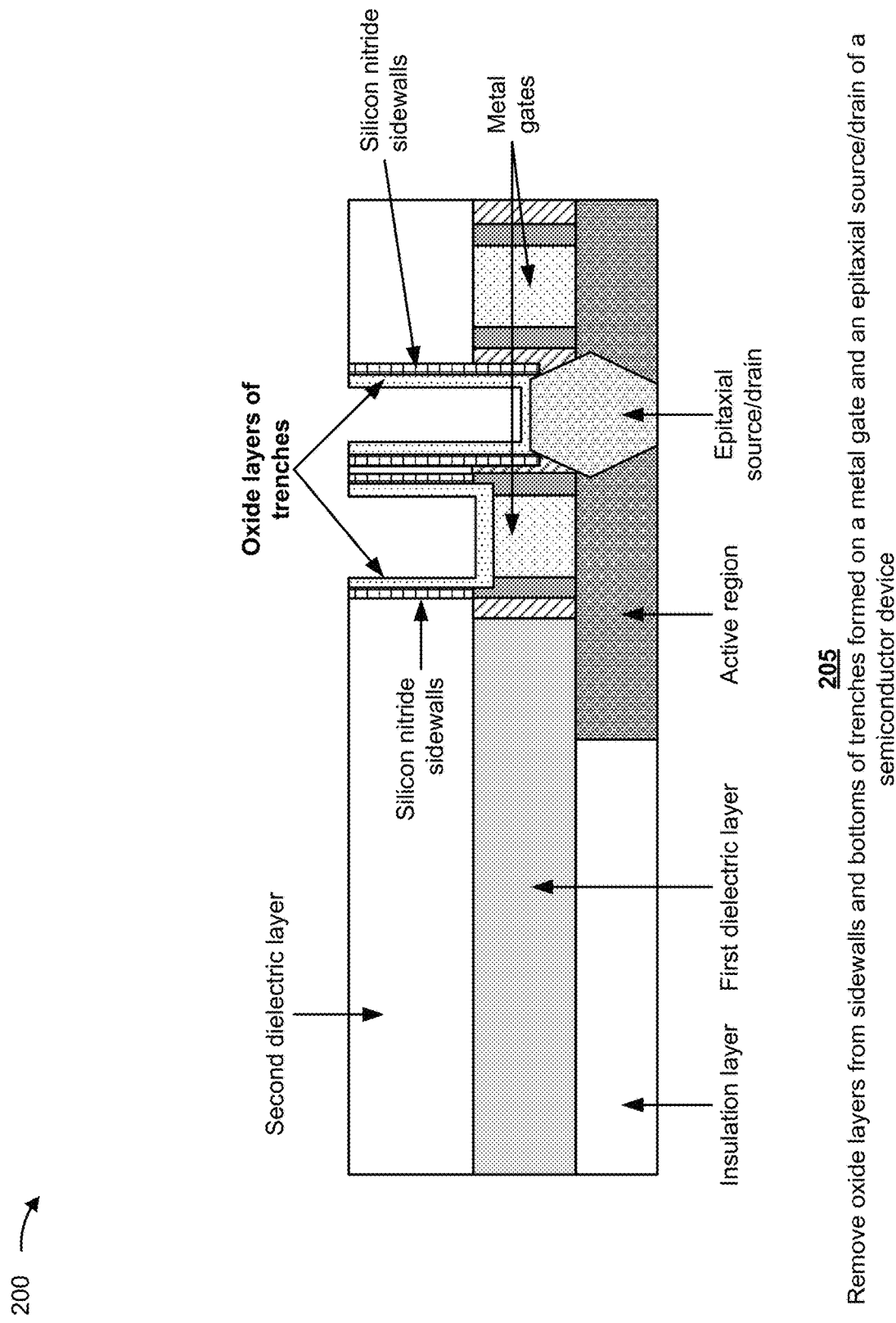
FIGS. 2A-2N are diagrams of one or more example operations involved in manufacturing an example semiconductor device described herein.
Figure 2B:
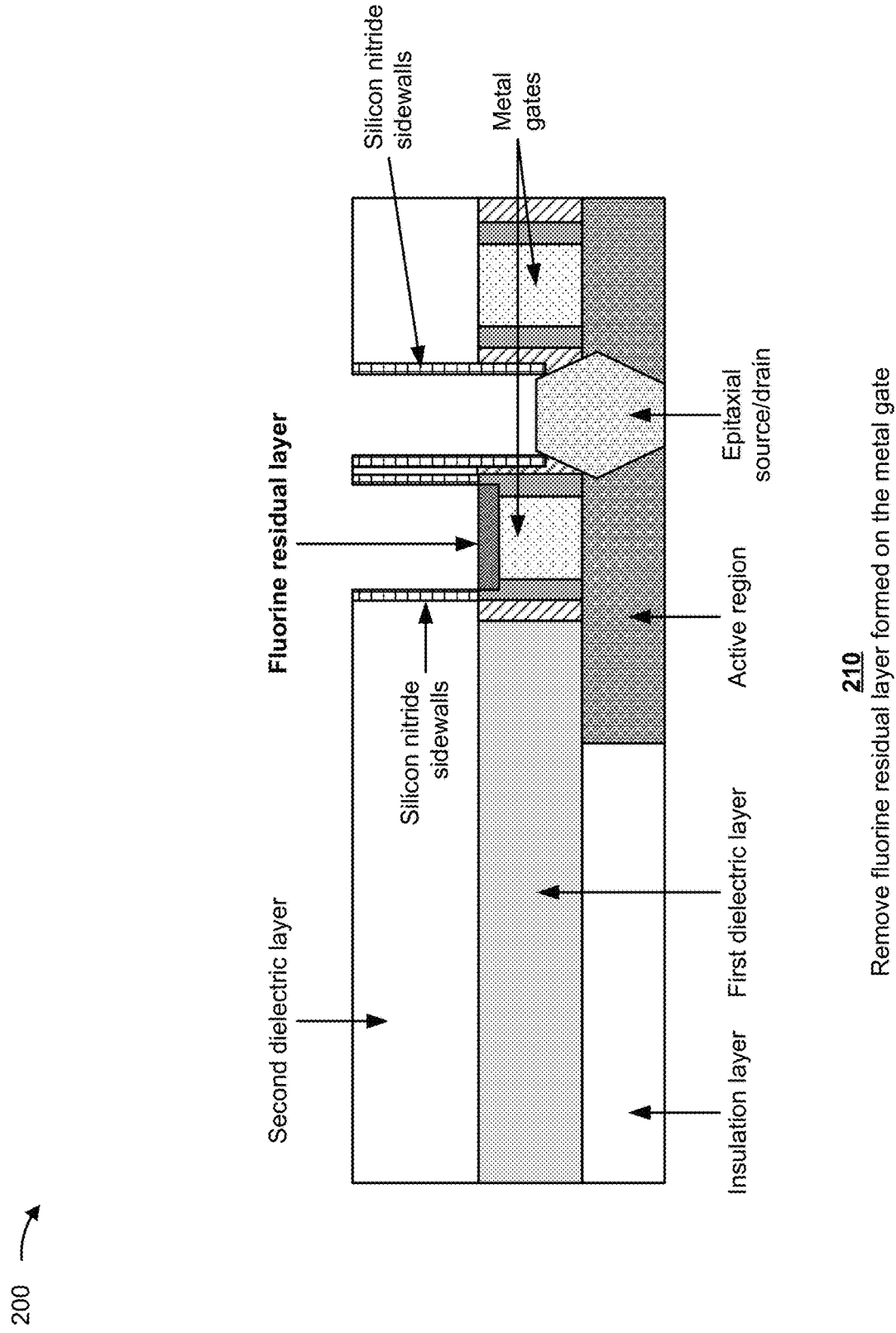
Figure 2D:
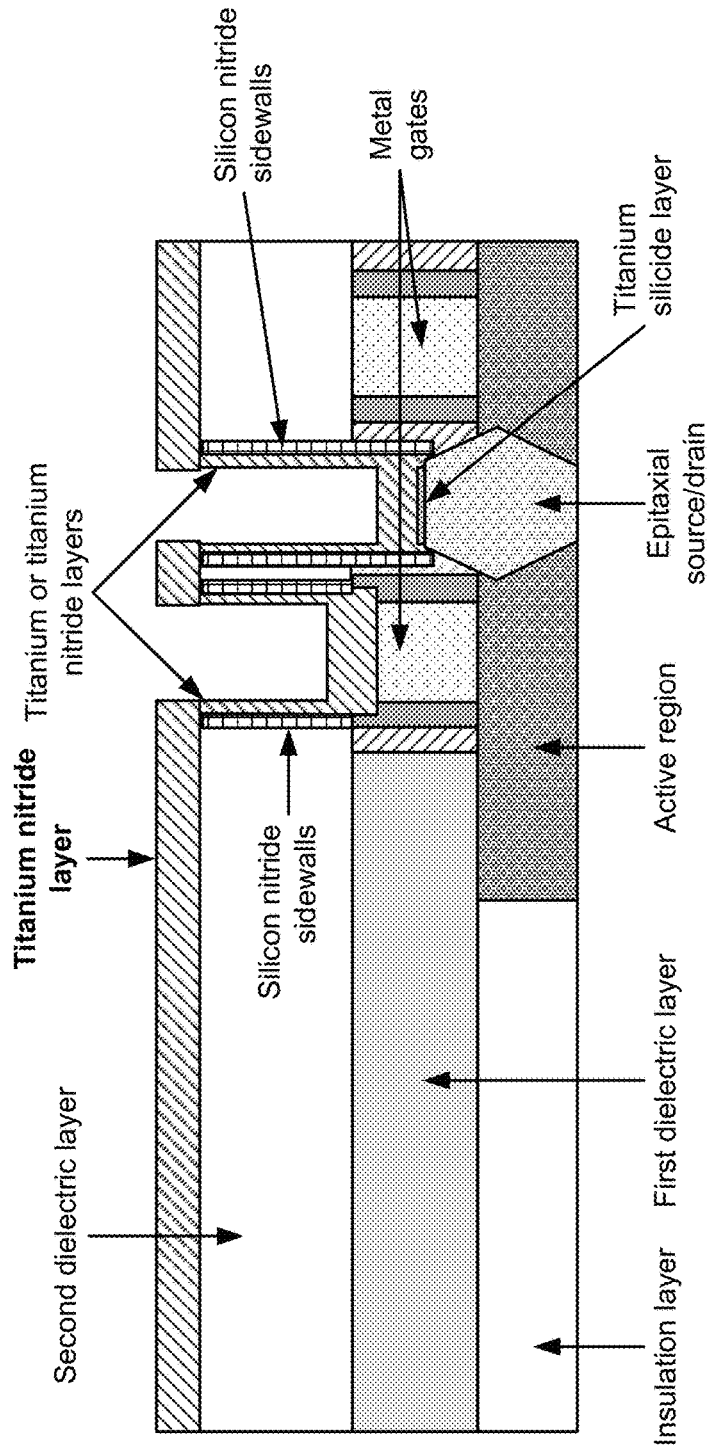
Figure 2E:
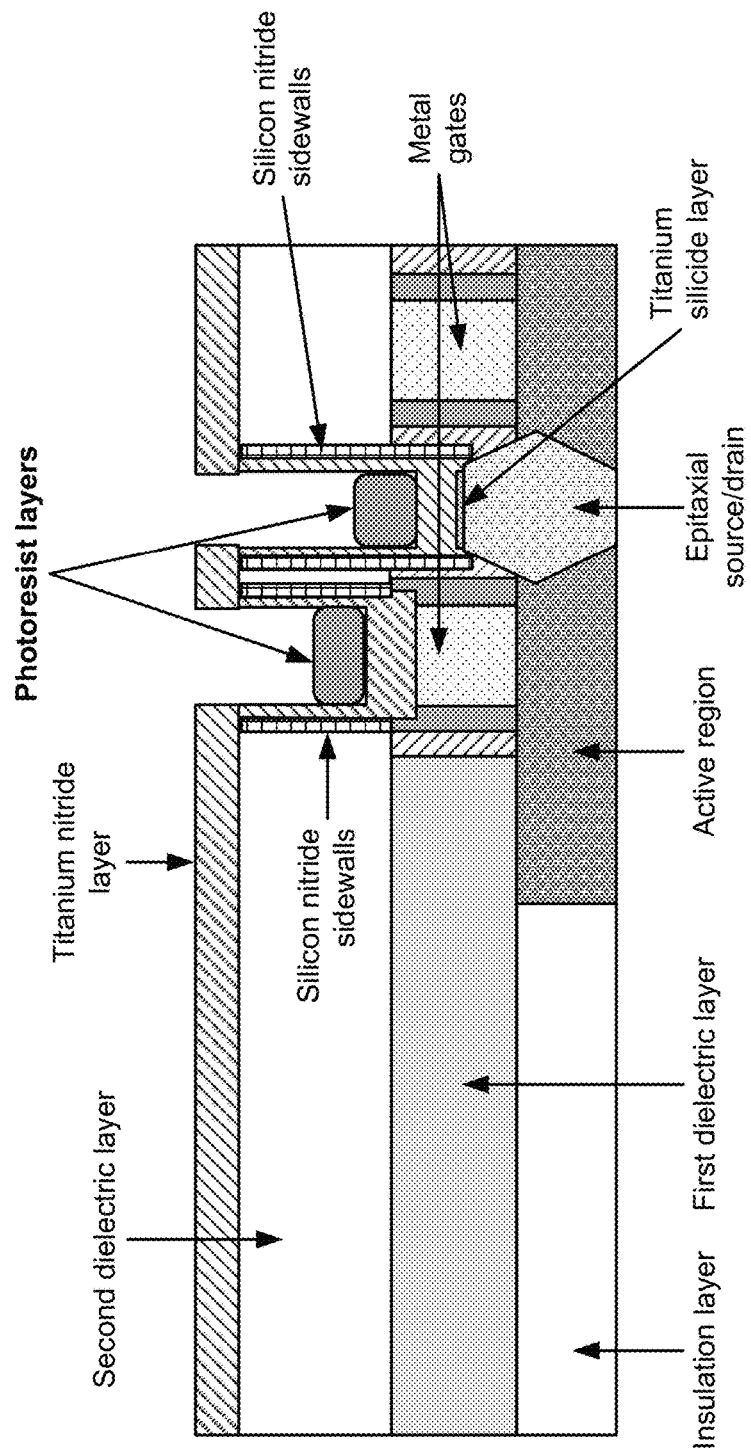
Figure 2F:
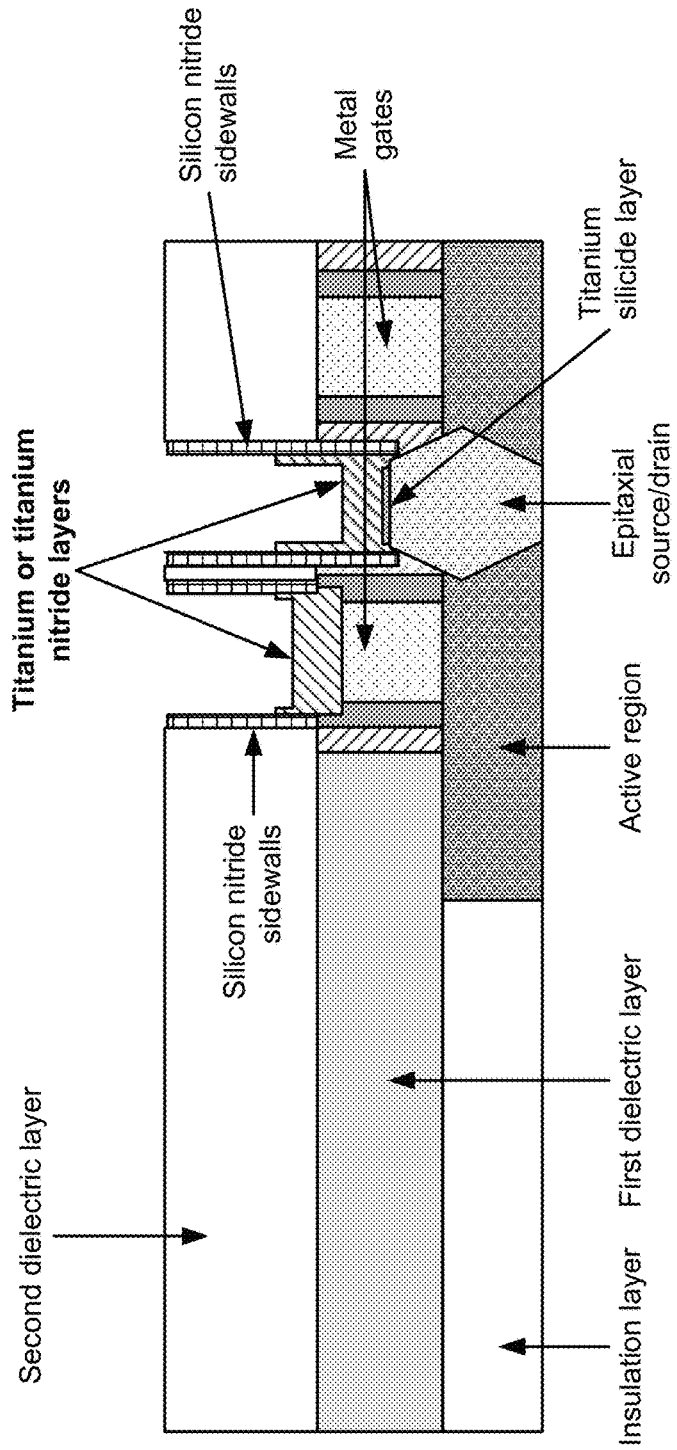
Figure 2H:
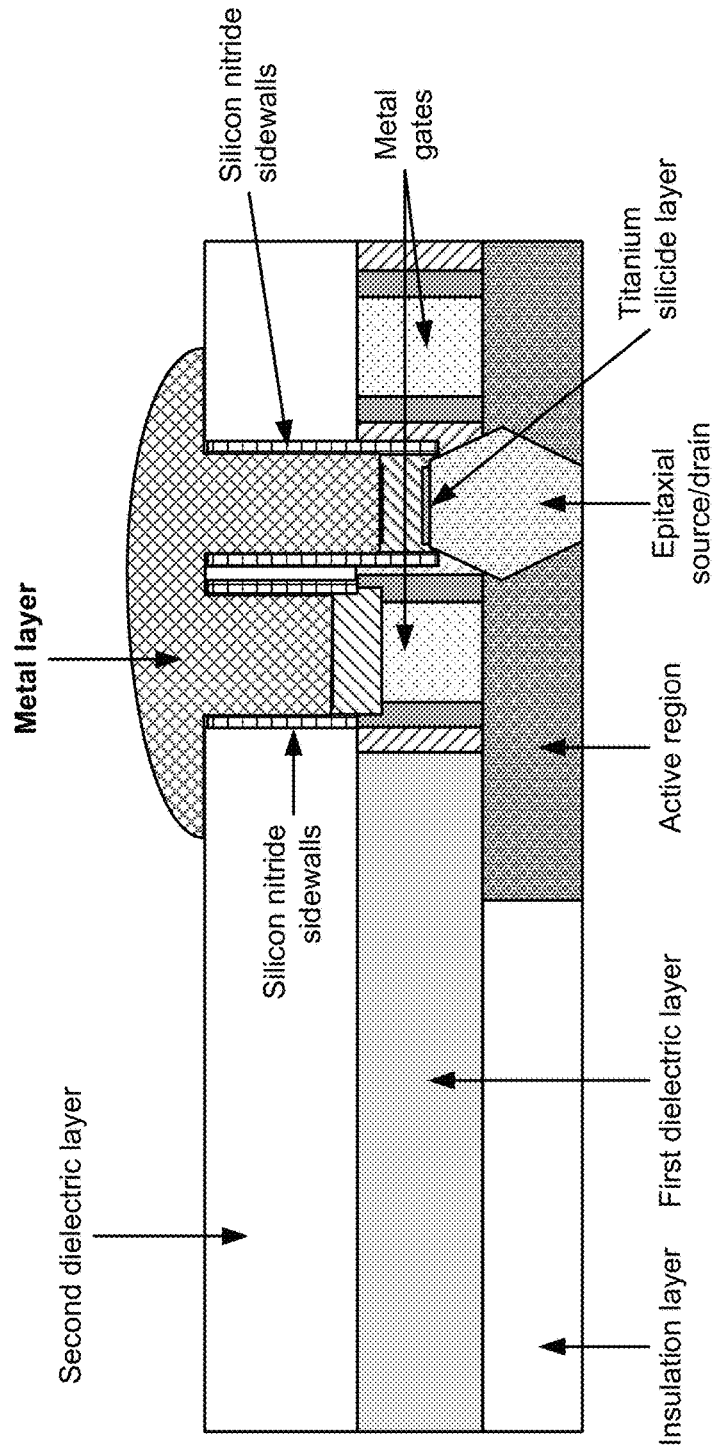
Figure 2I:
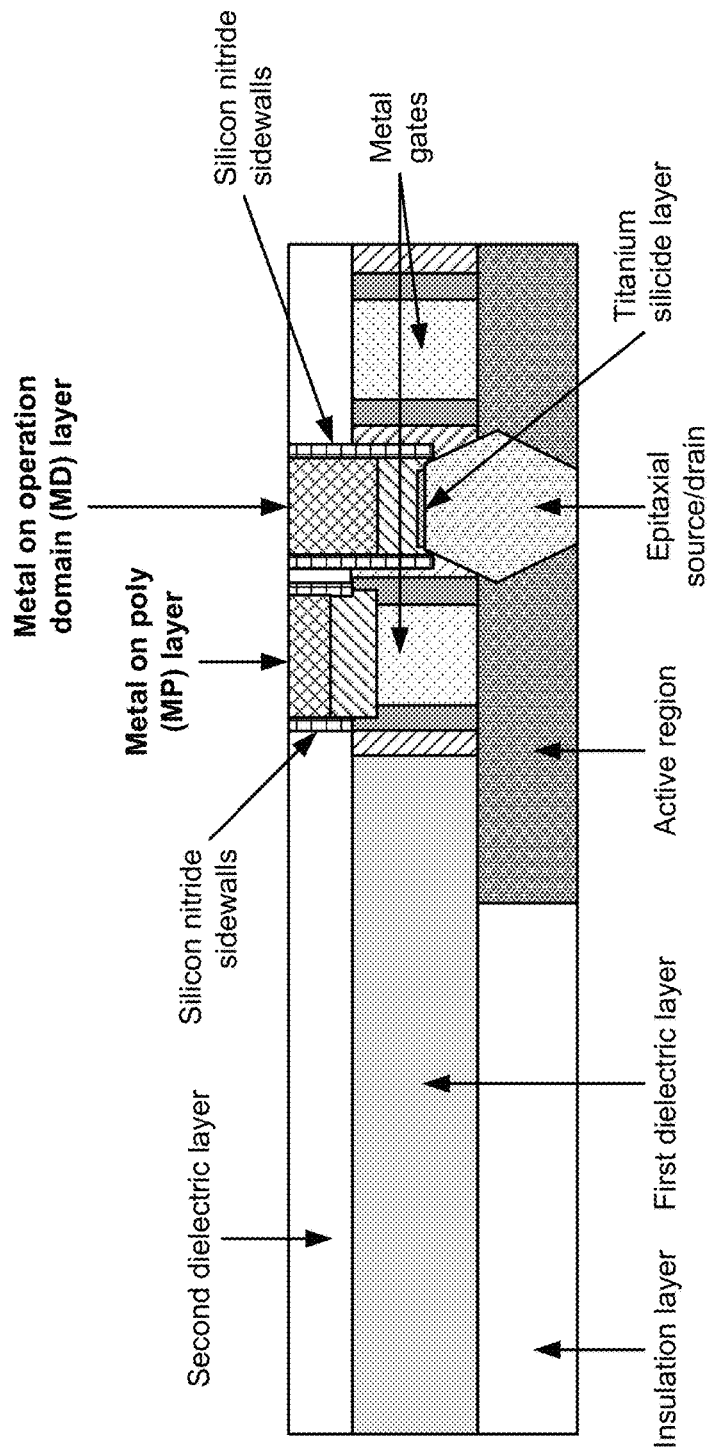
Figure 2J:
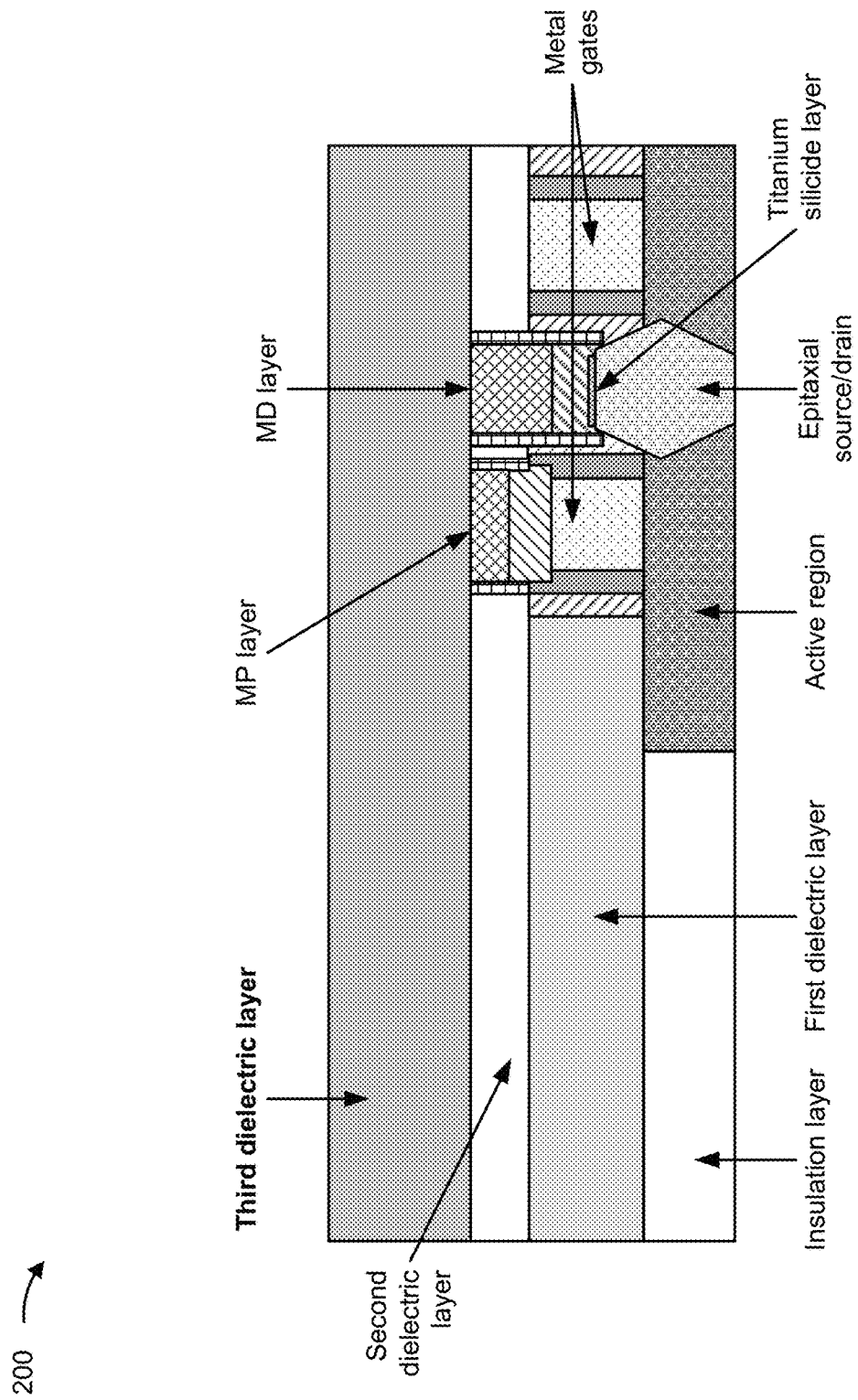
Figure 2K:
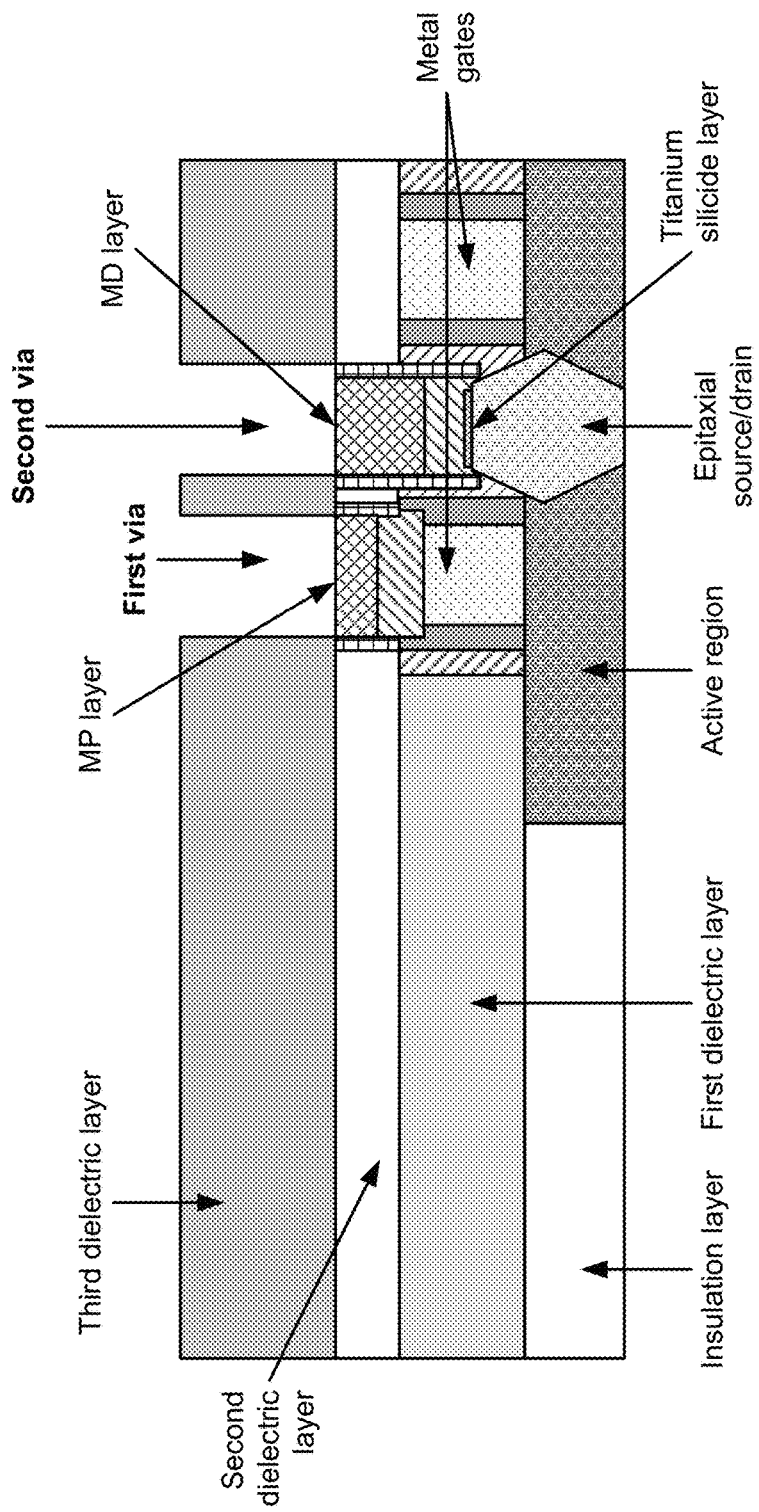
Figure 2L:
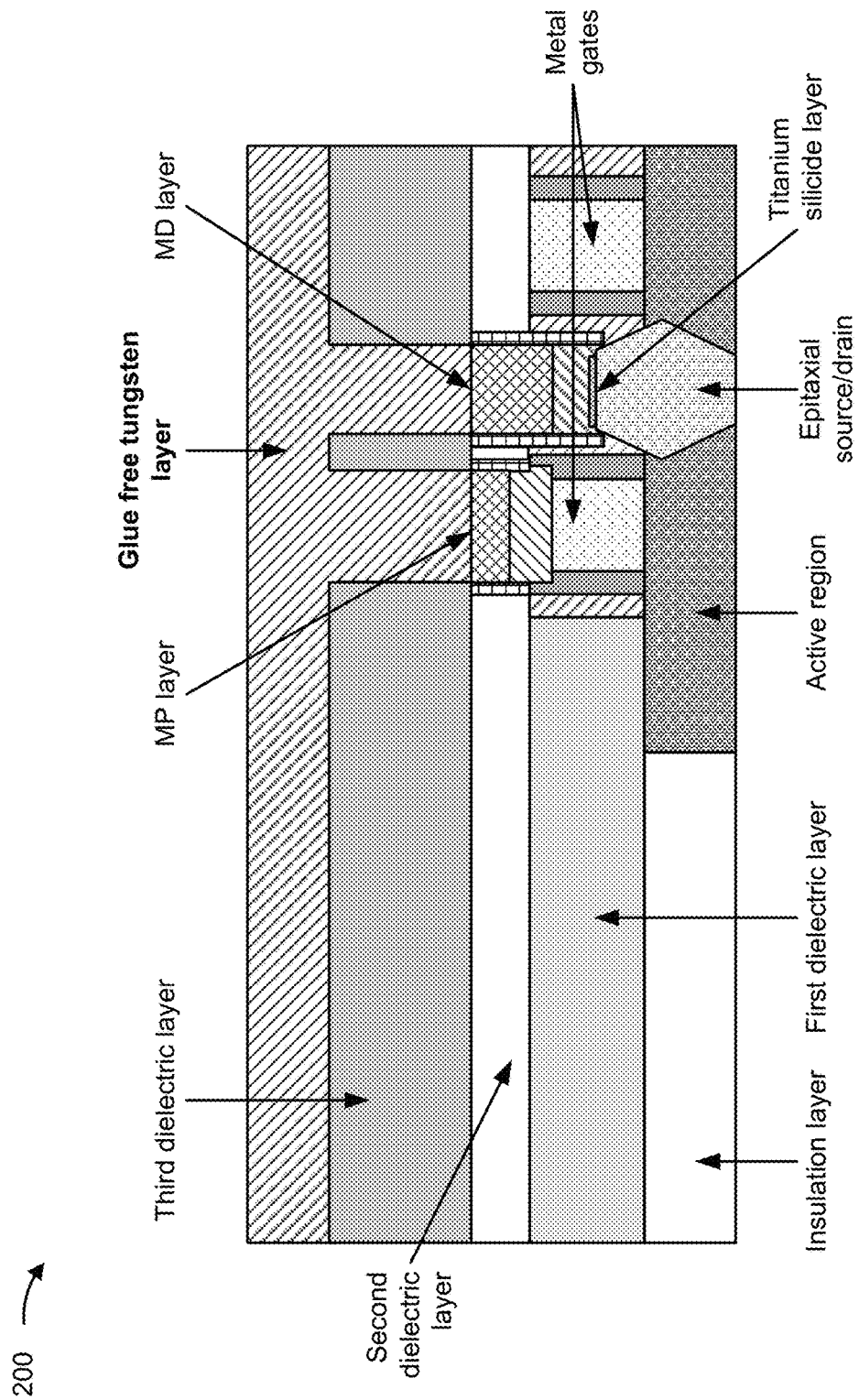
Figure 2M:
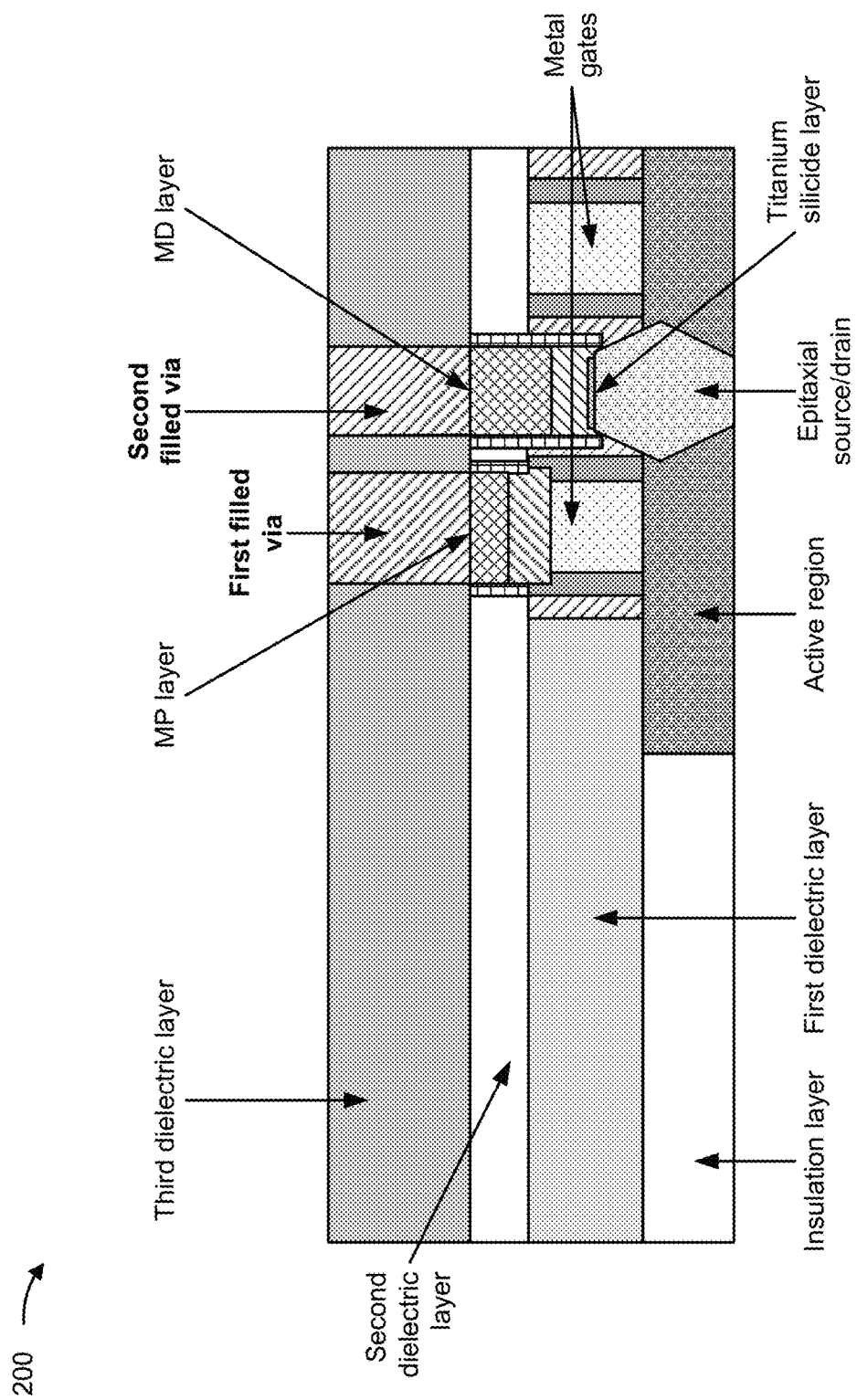
Figure 2N:
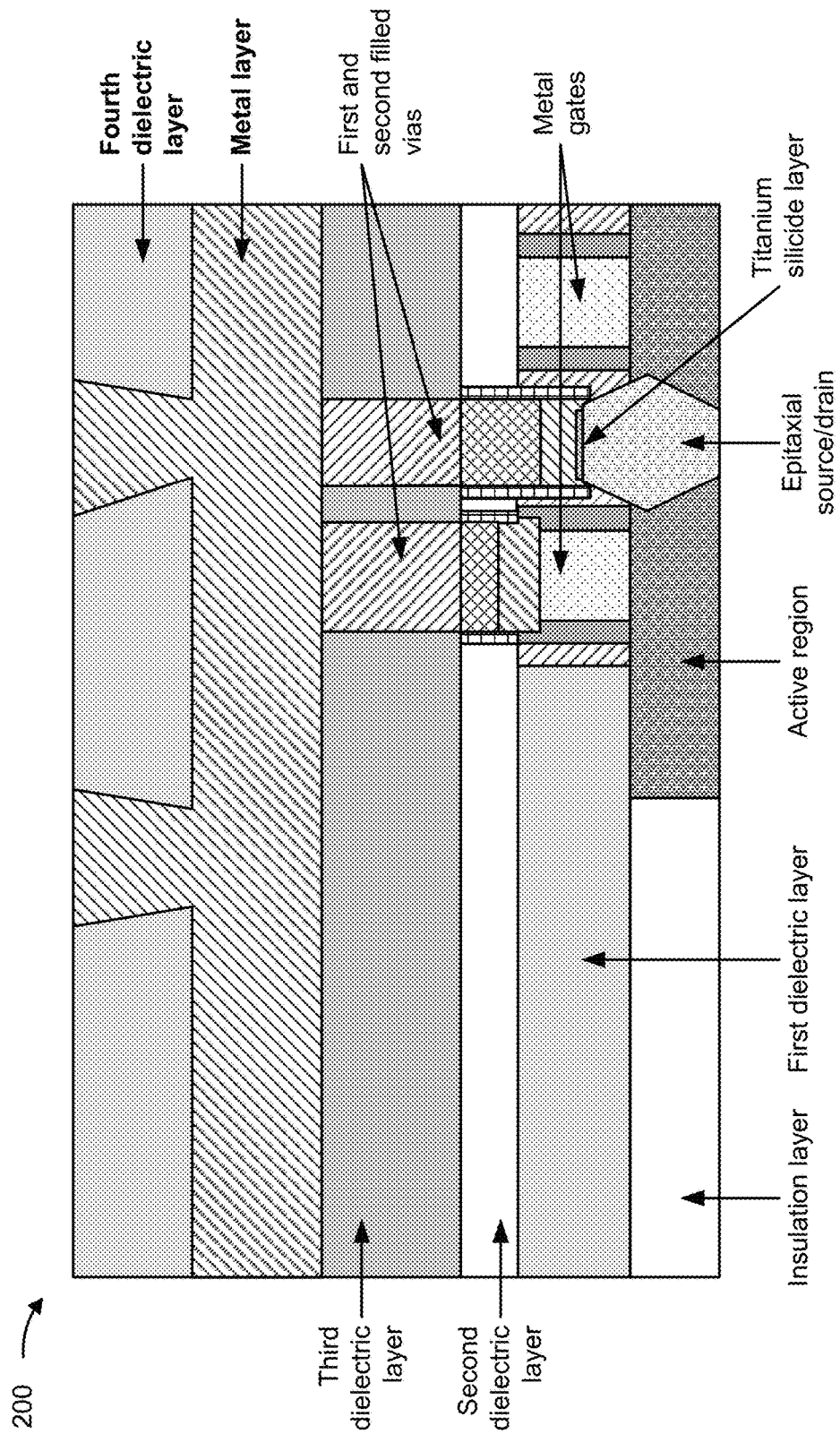

FIGS. 2A-2N are diagrams of one or more example operations 200 involved in manufacturing an example semiconductor device (e.g., a logic device, a memory device, an SRAM, a MOSFET, and/or the like). As indicated above, the chambers included in the tool configuration illustrated and described above in connection with FIG. 1 and/or other tools/chambers may be used to process the example semiconductor device.

As shown in FIG. 2A, the semiconductor device may include an insulation layer, an active region (e.g., which may also be referred to as an operation domain (OD) layer), and an epitaxial source/drain formed in and extending above the active region. A first dielectric layer may be formed over the insulation layer and over a portion of the active region, and metal gates (e.g., a first metal gate to the left in FIG. 2A and a second metal gate to the right in FIG. 2A) may be formed in the first dielectric layer. A second dielectric layer may be formed over the first dielectric layer and the second metal gate. Trenches may be formed in the second dielectric layer above the epitaxial source/drain and the first metal gate. A first trench may be formed above the first metal gate and a second trench may be formed above the epitaxial source/drain. In some implementations, the first trench and the second trench each includes a width in a range from approximately twenty-two nanometers (22 nm) to approximately twenty-four nanometers (24 nm), and an aspect ratio in a range from approximately two (2) to approximately four (4). An aspect ratio of a trench may be determined by dividing a depth of the trench by a width (e.g., a trench opening) of the trench. The trenches may include silicon nitride sidewalls. Oxide layers may be formed on the silicon nitride sidewalls and on bottoms of the trenches.

The insulation layer may include a material that insulates other portions of the semiconductor device. For example, the insulation layer may include tantalum nitride, silicon oxide, silicate glass, silicon oxycarbide, and/or the like. The active region may include a material that insulates the metal gates and the epitaxial source/drain from other portions of the semiconductor device. For example, the active region may include tantalum nitride, silicon oxide, silicate glass, silicon oxycarbide, and/or the like. The epitaxial source/drain may include a silicon germanium formed via epitaxial growth. In some implementations, the epitaxial source/drain forms a source/drain plug that is electrically coupled to one or more other components of the semiconductor device. The first dielectric layer may include a material that electrically insulates the first metal gate and the second metal gate from each other and from other components of the semiconductor device. For example, the first dielectric layer may include silicon, silicon nitride, silicon oxide, and/or the like. The first and second metal gates may include a conductive metal, such as titanium, cobalt, tungsten, aluminum, copper, ruthenium, iridium, and/or the like. The second dielectric layer may include a material that electrically insulates the trenches (e.g., components to be provided in the trenches) from each other and from other components of the semiconductor device. For example, the second dielectric layer may include silicon, silicon nitride, silicon oxide, and/or the like.

As further shown in FIG. 2A, and by reference number 205, the oxide layers may be removed from the sidewalls and the bottoms of the trenches formed on the first metal gate and the epitaxial source/drain of the semiconductor device. In some implementations, the pre-clean chambers of the tool configuration described above in connection with FIG. 1 may be used to remove the oxide layers from the sidewalls and the bottoms of the trenches formed on the first metal gate and the epitaxial source/drain of the semiconductor device.

As shown in FIG. 2B, removal of the oxide layers from the sidewalls and the bottoms of the trenches may cause a fluorine residual layer to form at the bottom of the first trench on top of the first metal gate. The fluorine residual layer causes higher contact resistance between the first metal gate and other components of the semiconductor device (e.g., such as an MP layer to be formed over the metal gate), and the higher contact resistance degrades performance of the semiconductor device. In order to prevent the fluorine residual layer from forming on the first metal gate or to remove the fluorine residual layer formed on the first metal gate, as indicated by reference number 210 in FIG. 2B, the degas chamber of the tool configuration described above in connection with FIG. 1 may be used to process the semiconductor device. For example, the degas chamber may be used to remove the fluorine residual layer that was formed during removal of the oxide layers in the pre-clean chambers.

During removal of the fluorine residual layer from the bottom of the first trench on top of the first metal gate, the degas chamber may heat to an internal temperature of greater than or equal to three-hundred degrees Celsius (≥300° C.). The elevated internal temperature of the degas chamber causes the temperature of the semiconductor device to increase. The semiconductor device may be heated or annealed in the degas chamber as part of an in-situ high-temperature anneal process until and/or after the temperature of the semiconductor device reaches or exceeds the temperature at which the fluorine residual layer decomposes (e.g., >210° C.). The fluorine residual layer decomposes and transitions to a gas or a vapor.

Moreover, during removal of the fluorine residual layer, a vacuum may be formed in the degas chamber during removal of the fluorine residual layer. The vacuum may be used to remove the gaseous or vaporized fluorine residual layer from the degas chamber so that the fluorine residual layer does not redeposit back onto the semiconductor device as the degas chamber ramps down in internal temperature toward the completion of the in-situ high-temperature anneal process. In this way, the degas chamber removes the fluorine residual layer from the first metal gate such that a fluorine-free interface may be provided between the first metal gate and other components (e.g., an MP layer to be formed over the first metal gate) of the semiconductor device for contact resistance reduction, metal resistance reduction, and improved performance of the semiconductor device.

In some implementations, the degas chamber may be used to remove fluorine residual layers after each pre-clean chamber process described above in connection with reference number 205. In some implementations, the degas chamber may be used to remove fluorine residual layers after all of the pre-clean chamber processes described above in connection with reference number 205 are complete.

As shown in FIG. 2C, and by reference number 215, titanium or titanium nitride layers may be formed on the sidewalls and the bottoms of the trenches formed on the first metal gate and the epitaxial source/drain to cause a titanium silicide layer to form on the epitaxial source/drain. The titanium or titanium nitride layers may include a thickness in a range from approximately eighty angstroms (80 Å) to approximately two-hundred angstroms (200 Å) when the titanium or titanium nitride layers include only titanium, a thickness in a range from approximately twenty angstroms (20 Å) to approximately forty angstroms (40 Å) when the titanium or titanium nitride layers include only titanium nitride, and/or the like. The titanium silicide layer may be replaced with a nickel silicide layer, a cobalt silicide layer, a platinum silicide layer, and/or the like. In some implementations, the high bottom coverage Ti chamber and/or the CVD TiN chamber of the tool configuration described above in connection with FIG. 1 may be used to form the titanium or titanium nitride layers on the sidewalls and the bottoms of the trenches formed on the first metal gate and the epitaxial source/drain to cause the titanium silicide layer to form on the epitaxial source/drain.

As shown in FIG. 2D, and by reference number 220, a titanium nitride layer may be formed on the second dielectric layer and on portions of the titanium or titanium nitride layers. The titanium nitride layer may include a thickness in a range from approximately four nanometers (4 nm) to approximately six nanometers (6 nm). In some implementations, the high bottom coverage Ti chamber and/or the CVD TiN chamber of the tool configuration described above in connection with FIG. 1 may be used to form the titanium nitride layer on the second dielectric layer and on portions of the titanium or titanium nitride layers. The RTA chamber may be used after forming the titanium nitride layer, and may perform an annealing operation on the semiconductor device at a temperature of five-hundred and seventy-five degrees Celsius (e.g., 575° C.) for a time period (e.g., fifteen seconds).

As shown in FIG. 2E, and by reference number 225, photoresist layers may be formed on the titanium or titanium nitride layers formed on the bottoms of the trenches formed on the first metal gate and the epitaxial source/drain. The photoresist layers each may include a photoresist material, such as a bottom-layer antireflective coating (BARC) material, a photopolymeric photoresist (e.g., methyl methacrylate), a photodecomposing photoresist (e.g., diazonaphthaquinone), a photocrosslinking photoresist, and/or the like. In some implementations, the photoresist layers are formed on the titanium or titanium nitride layers formed on the bottoms of the trenches so that a portion of titanium or titanium nitride layers may be removed. In some implementations, a photoresist tool, such as a spin coating tool or another type of tool, may be used to form the photoresist layers on the titanium or titanium nitride layers formed on the bottoms of the trenches formed on the metal gate and the epitaxial source/drain.

As shown in FIG. 2F, and by reference number 230, the photoresist layers, the titanium nitride layer, and portions of the titanium or titanium nitride layers may be removed based on formation of the photoresist layers on the bottoms of the trenches. In some implementations, one or more etching operations are performed to remove the photoresist layers, the titanium nitride layer, and portions of the titanium or titanium nitride layers based on formation of the photoresist layers on the bottoms of the trenches. For example, a dry etching operation, utilizing carbon tetrafluoride gas, hexafluorocyclobutane gas, octafluorocyclobutane gas, oxygen gas, and/or the like, may be performed to remove the photoresist layers, the titanium nitride layer, and portions of the titanium or titanium nitride layers based on formation of the photoresist layers on the bottoms of the trenches. In some implementations, an etch tool, such as a dry etch tool, a wet etch tool, or another type of etch tool, may be used to remove the photoresist layers, the titanium nitride layer, and portions of the titanium or titanium nitride layers based on formation of the photoresist layers on the bottoms of the trenches.

As shown in FIG. 2G, and by reference number 235, the trenches formed on the first metal gate and the epitaxial source/drain may be pre-cleaned and an atomic layer of titanium nitride and a seed layer of metal may be formed in the trenches. In some implementations, the pre-clean chambers of the tool configuration described above in connection with FIG. 1 may be used to pre-clean the trenches formed on the first metal gate and the epitaxial source/drain to remove organic contaminants, oxide films, ionic contamination, and/or the like from the trenches. In some implementations, the CVD TiN chamber of the tool configuration described above in connection with FIG. 1 may be used to form the atomic layer of titanium nitride in the trenches. In some implementations, a metal deposition operation is performed to form the seed layer of metal (e.g., a cobalt material) in the trenches with the atomic layer of titanium nitride. The deposition chamber of the tool configuration described above in connection with FIG. 1 may be used to form the seed layer of metal in the trenches.

As shown in FIG. 2H, and by reference number 240, a metal layer may be formed in the trenches formed on the first metal gate and the epitaxial source/drain. In some implementations, the metal layer is formed in the trenches and on top of the titanium or titanium nitride layers formed on the bottoms of the trenches. In some implementations, the metal layer creates an MP layer over the first metal gate and creates an MD layer over the epitaxial source/drain. The metal layer (e.g., the MP layer and the MD layer) may include a cobalt material, a ruthenium material, an iridium material, a molybdenum material, and/or the like. In some implementations, a metal deposition operation is performed to form the metal layer in the trenches formed on the first metal gate and the epitaxial source/drain. For example, PVD, CVD, ALD, MBE, ECD, and/or the like may be performed to form the metal layer in the trenches formed on the first metal gate and the epitaxial source/drain.

In some implementations, the deposition chamber of the tool configuration described above in connection with FIG. 1 may be used to form the metal layer in the trenches formed on the first metal gate and the epitaxial source/drain. In some implementations, the degas chamber may be used to remove additional fluorine residual layers from the first metal gate (and other metal gates of the semiconductor device) after each pre-clean chamber process described above in connection with reference number 235. In some implementations, the degas chamber may be used to remove additional fluorine residual layers after all of the pre-clean chamber processes described above in connection with reference number 235 are complete. In some implementations, the degas chamber may be used to remove additional fluorine residual layers using one or more of the techniques described above in connection with reference number 210. In this way, the degas chamber removes fluorine residual layers from the first metal gate (and other metal gates of the semiconductor device) such that a fluorine-free interface is provided between the first metal gate and the MP layer.

As shown in FIG. 2I, and by reference number 245, the metal layer and the second dielectric layer may be polished to make the metal layer substantially planar with the second dielectric layer and to form an MP layer over the first metal gate and an MD layer over the epitaxial source/drain. In some implementations, a chemical mechanical polishing (CMP) operation is performed to polish the metal layer and the second dielectric layer to make the metal layer substantially planar with the second dielectric layer and to form the MP layer over the first metal gate and the MD layer over the epitaxial source/drain. For example, a CMP tool may be used to polish the metal layer and the second dielectric layer to make the metal layer substantially planar with the second dielectric layer and to form the MP layer over the first metal gate and the MD layer over the epitaxial source/drain.

As shown in FIG. 2J, and by reference number 250, a third dielectric layer may be formed on the second dielectric layer, the MP layer, and the MD layer. The third dielectric layer may include a material that electrically insulates components of the semiconductor device (e.g., the MP layer and the MD layer) from other components of the semiconductor device. For example, the third dielectric layer may include silicon, silicon nitride, silicon oxide, and/or the like. In some implementations, the deposition chamber of the tool configuration described above in connection with FIG. 1 may be used to form the third dielectric layer on the second dielectric layer, the MP layer, and the MD layer.

As shown in FIG. 2K, and by reference number 255, portions of the third dielectric layer may be removed to create a first via in the third dielectric layer on the MP layer and a second via in the third dielectric layer on the MD layer. In some implementations, the first via and the second via each includes a width in a range from approximately fourteen nanometers (14 nm) to approximately twenty-two nanometers (22 nm), and an aspect ratio in a range from approximately one (1) to approximately two (2). In some implementations, one or more photoresist operations are performed to apply and pattern a photoresist layer over the third dielectric layer except where the first via and the second via are to be formed. One or more etching operations may be performed to remove the photoresist layer and to create the first via in the third dielectric layer on the MP layer and the second via in the third dielectric layer on the MD layer. For example, a dry etching operation, utilizing carbon tetrafluoride gas, hexafluorocyclobutane gas, octafluorocyclobutane gas, oxygen gas, and/or the like, may be performed to remove the photoresist layer and to form the first via and the second via. In some implementations, a photoresist tool and/or an etch tool may be used to remove portions of the third dielectric layer to create the first via in the third dielectric layer on the MP layer and the second via in the third dielectric layer on the MD layer.

As shown in FIG. 2L, and by reference number 260, a glue-free tungsten layer may be formed on the third dielectric layer and within the first via and the second via. In some implementations, the tungsten layer may be replaced by a ruthenium material, an iridium material, a molybdenum material, and/or the like. The tungsten layer may be glue free (e.g., the use of glue may degrade performance of the semiconductor device) since glue is not required to be provided in the first via and the second via prior to formation of the tungsten layer within the first via and the second via. In some implementations, the deposition chamber of the tool configuration described above in connection with FIG. 1 may be used to form the glue-free tungsten layer on the third dielectric layer and within the first via and the second via. In some implementations, forming the glue-free tungsten layer on the third dielectric layer and within the first via and the second via may include forming a metal organic tungsten layer on the third dielectric layer and within the first via and the second via, depositing an atomic layer of tungsten on the metal organic tungsten layer, and performing a chemical vapor deposition operation to provide tungsten on the atomic layer of tungsten and the metal organic tungsten layer.

As shown in FIG. 2M, and by reference number 265, the glue-free tungsten layer and the third dielectric layer may be polished to make the glue-free tungsten layer substantially planar with the third dielectric layer and to form a first filled via on the MP layer and a second filled via on the MD layer. In some implementations, a CMP operation is performed to polish the glue-free tungsten layer and the third dielectric layer to make the glue-free tungsten layer substantially planar with the third dielectric layer and to form the first filled via on the MP layer and the second filled via on the MD layer. For example, a CMP tool may be used to polish the glue-free tungsten layer and the third dielectric layer to make the glue-free tungsten layer substantially planar with the third dielectric layer and to form the first filled via on the MP layer and the second filled via on the MD layer.

As shown in FIG. 2N, and by reference number 270, one or more back end of the line (BEOL) processes may be performed to form a metal layer and a fourth dielectric layer on the third dielectric layer, the first filled via, and the second filled via. For example, a metal layer (e.g., a copper layer) may be formed on the third dielectric layer, the first filled via, and the second filled via. The metal layer may be etched to form one or more contacts that extend above the surface of the metal layer. The fourth dielectric layer may be formed on the metal layer and may cover the metal layer except for top surfaces of the one or more contacts. The fourth dielectric layer may include a material that electrically insulates components of the semiconductor device from other components of the semiconductor device. For example, the fourth dielectric layer may include silicon, silicon nitride, silicon oxide, and/or the like. In some implementations, the deposition tool of the tool configuration described above in connection with FIG. 1, an etch tool, and/or a photoresist tool may be used to perform the one or more BEOL processes to form the metal layer and the fourth dielectric layer on the third dielectric layer, the first filled via, and the second filled via.

As indicated above, FIGS. 2A-2N are provided merely as one or more examples. Other examples may differ from what is described with regard to FIGS. 2A-2N.

Figure 3:
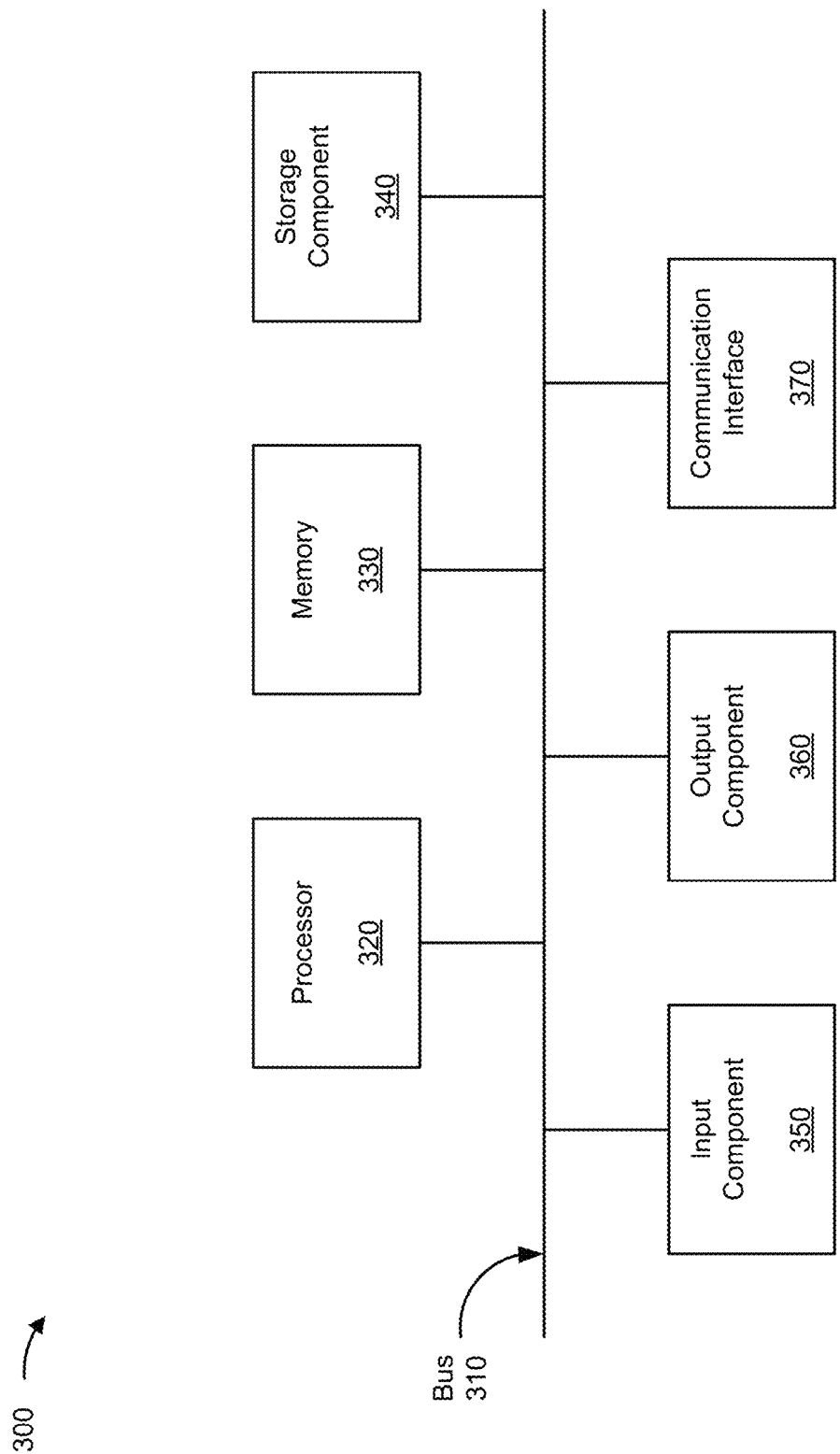
FIG. 3 is a diagram of example components of one or more devices of FIG. 1.

FIG. 3 is a diagram of example components of a device 300. In some implementations, the degas chamber, the pre-clean chambers, the high bottom coverage Ti chamber, the CVD TiN chamber, the RTA chamber, and/or the handler device may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more LEDs).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, an RF interface, a universal serial bus (USB) interface, a wireless local area interface, a cellular network interface, and/or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
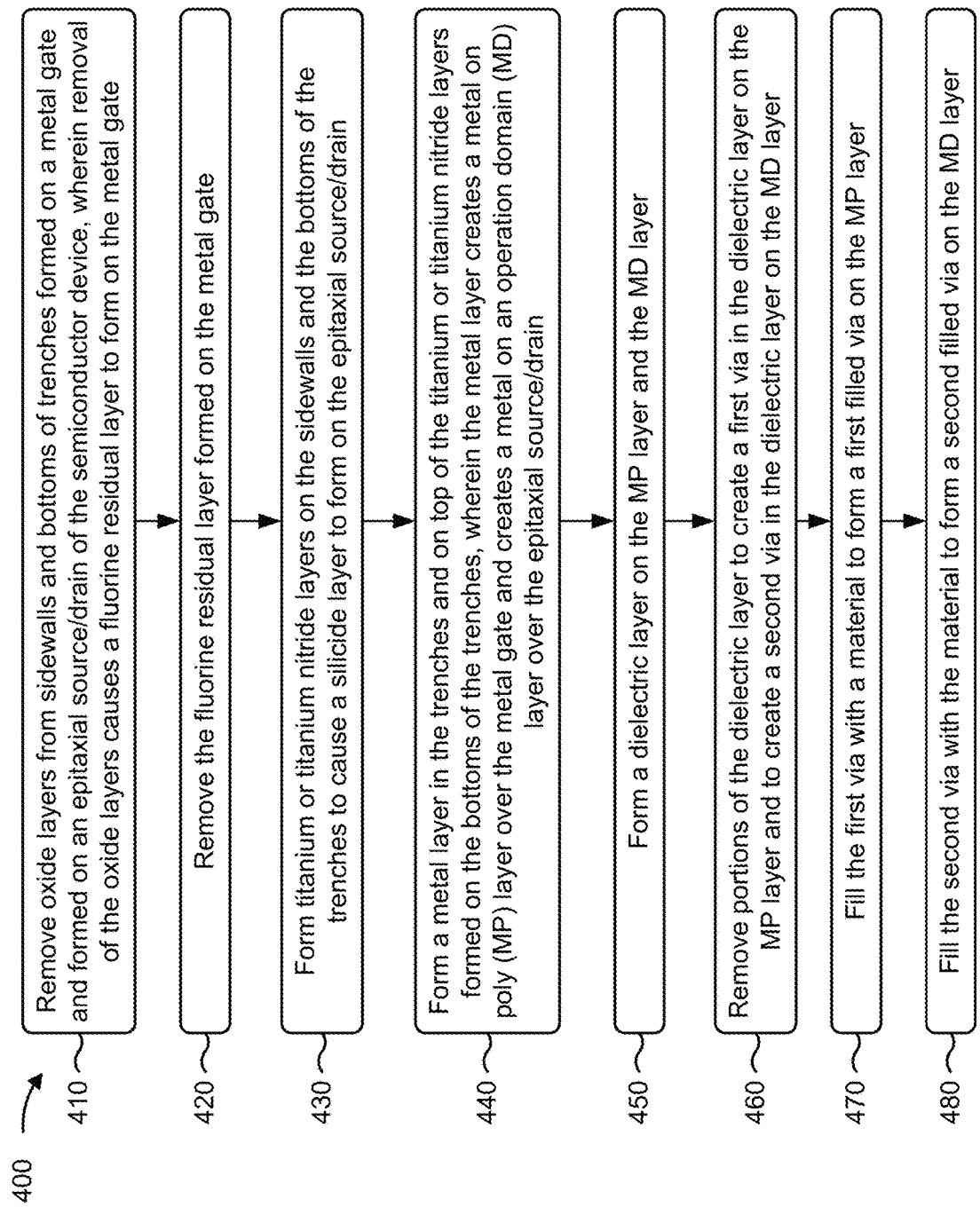
FIGS. 4 and 5 are flowcharts of example processes for manufacturing the example semiconductor device with a fluorine-free interface.

FIG. 4 is a flow chart of an example process 400 for manufacturing an example semiconductor device with a fluorine-free interface. In some implementations, one or more process blocks of FIG. 4 may be performed by a tool configuration (e.g., the tool configuration of FIG. 1). In some implementations, one or more process blocks of FIG. 4 may be performed by another device or a group of devices separate from or including the tool configuration. Additionally, or alternatively, one or more process blocks of FIG. 4 may be performed by one or more components of a device 300, such as processor 320, memory 330, storage component 340, input component 350, output component 360, communication interface 370, and/or the like.

As shown in FIG. 4, process 400 may include removing oxide layers from sidewalls and bottoms of trenches formed on a metal gate and formed on an epitaxial source/drain of the semiconductor device, wherein removal of the oxide layers causes a fluorine residual layer to form on the metal gate (block 410). For example, the tool configuration (e.g., a pre-clean chamber of the tool configuration of FIG. 1) may remove oxide layers from sidewalls and bottoms of trenches formed on a metal gate and formed on an epitaxial source/drain of the semiconductor device, as described above in connection with reference number 205 of FIG. 2A. In some implementations, removal of the oxide layers causes a fluorine residual layer to form on the metal gate. The metal gate may include a gap fill from a tungsten material, a cobalt material, a ruthenium material, or an iridium material. The trenches may include a first trench formed on the metal gate and a second trench formed on the epitaxial source/drain, where the first trench and the second trench may each include a width in a range from approximately twenty-two nanometers to approximately twenty-four nanometers, and an aspect ratio in a range from approximately two to approximately four.

As further shown in FIG. 4, process 400 may include removing the fluorine residual layer formed on the metal gate (block 420). For example, the tool configuration (e.g., the degas chamber of the tool configuration of FIG. 1) may remove the fluorine residual layer formed on the metal gate, as described above in connection with reference number 210 of FIG. 2B. Removing the fluorine residual layer may include processing the semiconductor device with an in-situ high temperature degas chamber that removes the fluorine residual layer formed on the metal gate due to a vacuum used by the in-situ high temperature degas chamber. The in-situ high temperature degas chamber may operate at a temperature of greater than or equal to three-hundred degrees Celsius. The in-situ high temperature degas chamber may perform one of atomic layer deposition, physical vapor deposition, chemical vapor deposition, or annealing on the semiconductor device to remove the fluorine residual layer formed on the metal gate.

As further shown in FIG. 4, process 400 may include forming titanium or titanium nitride layers on the sidewalls and the bottoms of the trenches to cause a silicide layer to form on the epitaxial source/drain (block 430). For example, the tool configuration may form titanium or titanium nitride layers on the sidewalls and the bottoms of the trenches to cause a silicide layer to form on the epitaxial source/drain, as described above in connection with reference number 215 of FIG. 2C. The silicide layer may include a titanium silicide layer, a nickel silicide layer, a cobalt silicide layer, or a platinum silicide layer. The titanium or titanium nitride layers may include a thickness in a range from approximately eighty angstroms to approximately two-hundred angstroms when the titanium or titanium nitride layers include only titanium, or a thickness in a range from approximately twenty angstroms to approximately forty angstroms when the titanium or titanium nitride layers include only titanium nitride.

As further shown in FIG. 4, process 400 may include forming a metal layer in the trenches and on top of the titanium or titanium nitride layers formed on the bottoms of the trenches, wherein the metal layer creates an MP layer over the metal gate and creates an MD layer over the epitaxial source/drain (block 440). For example, the tool configuration may form a metal layer in the trenches and on top of the titanium or titanium nitride layers formed on the bottoms of the trenches, as described above in connection with reference numbers 220-245 of FIG. 2D-2H. In some implementations, the metal layer creates an MP layer over the metal gate and creates a metal on an MD layer over the epitaxial source/drain. The MD layer may include a cobalt material, a ruthenium material, an iridium material, or a molybdenum material. Forming the metal layer in the trenches may include performing an electrochemical plating operation to form the metal layer in the trenches.

As further shown in FIG. 4, process 400 may include forming a dielectric layer on the MP layer and the MD layer (block 450). For example, the tool configuration may form a dielectric layer on the MP layer and the MD layer, as described above in connection with reference number 250 of FIG. 2J.

As further shown in FIG. 4, process 400 may include removing portions of the dielectric layer to create a first via in the dielectric layer on the MP layer and to create a second via in the dielectric layer on the MD layer (block 460). For example, the tool configuration may remove portions of the dielectric layer to create a first via in the dielectric layer on the MP layer and to create a second via in the dielectric layer on the MD layer, as described above in connection with reference number 255 of FIG. 2K. The first via and the second via may each include a width in a range from approximately fourteen nanometers to approximately twenty-two nanometers, and an aspect ratio in a range from approximately one to approximately two.

As further shown in FIG. 4, process 400 may include filling the first via with a material to form a first filled via on the MP layer (block 470). For example, the tool configuration may fill the first via with a material to form a first filled via on the MP layer, as described above in connection with reference number 260 of FIG. 2L. The material to form the first filled via and the second filled via may include a tungsten material, a ruthenium material, an iridium material, or a molybdenum material. The first filled via may be provided on top of and contacts the MP layer, and the MP layer may be provided on top of the metal gate. When the material is tungsten, filling the first via with the material to form the first filled via may include forming a metal organic tungsten layer in the first via, depositing an atomic layer of tungsten on the metal organic tungsten layer in the first via, and performing a chemical vapor deposition operation to fill the first via with tungsten provided on the atomic layer of tungsten and the metal organic tungsten layer.

As further shown in FIG. 4, process 400 may include filling the second via with the material to form a second filled via on the MD layer (block 480). For example, the tool configuration may fill the second via with the material to form a second filled via on the MD layer, as described above in connection with reference number 265 of FIG. 2M.

In some implementations, process 400 includes forming a metal layer on the dielectric layer, the first filled via, and the second filled via.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
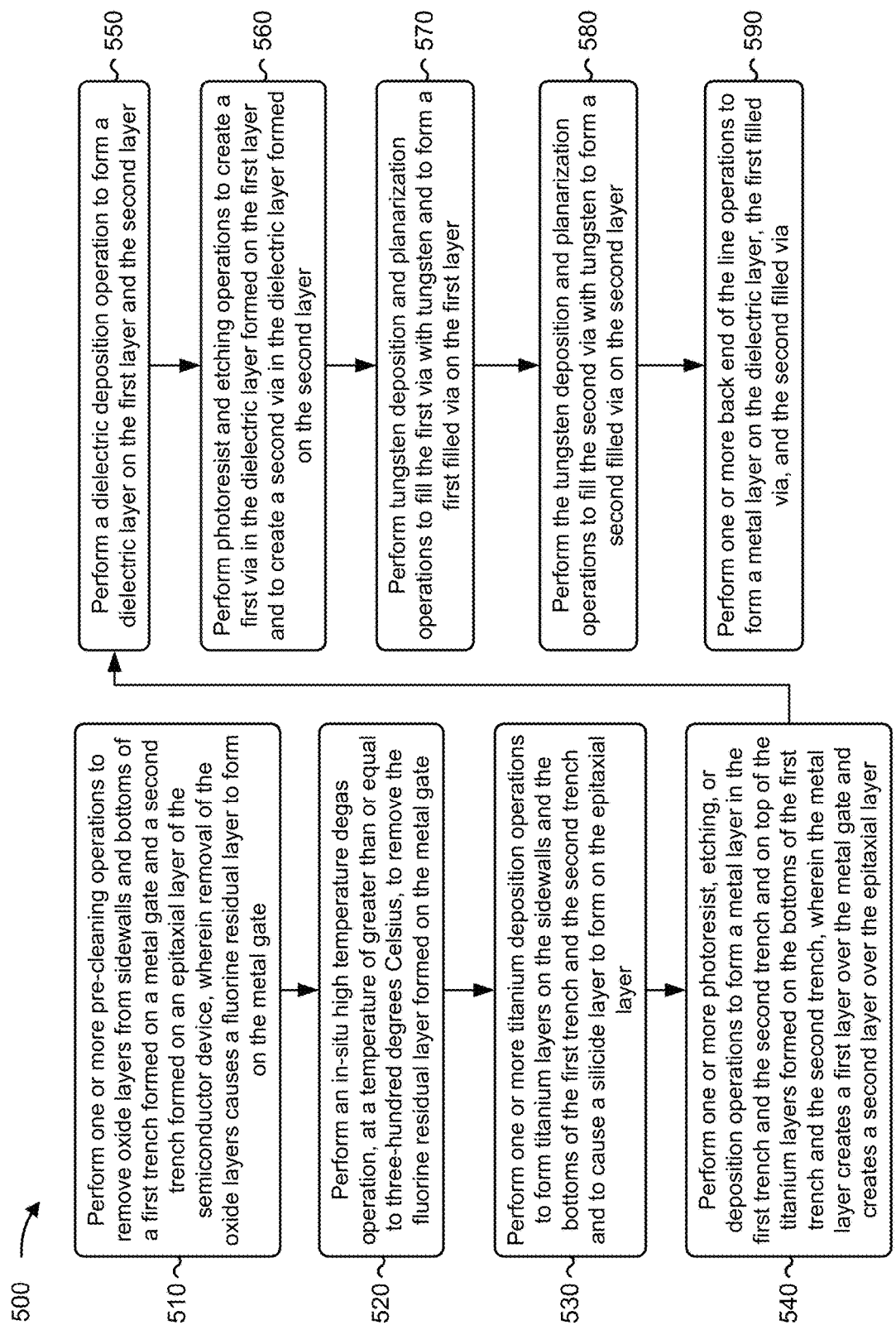

FIG. 5 is a flow chart of an example process 500 for manufacturing an example semiconductor device with a fluorine-free interface. In some implementations, one or more process blocks of FIG. 5 may be performed by a tool configuration (e.g., the tool configuration of FIG. 1). In some implementations, one or more process blocks of FIG. 5 may be performed by another device or a group of devices separate from or including the tool configuration. Additionally, or alternatively, one or more process blocks of FIG. 5 may be performed by one or more components of a device 300, such as processor 320, memory 330, storage component 340, input component 350, output component 360, communication interface 370, and/or the like.

As shown in FIG. 5, process 500 may include performing one or more pre-cleaning operations to remove oxide layers from sidewalls and bottoms of a first trench formed on a metal gate and a second trench formed on an epitaxial layer of the semiconductor device, wherein removal of the oxide layers causes a fluorine residual layer to form on the metal gate (block 510). For example, the tool configuration (e.g., a pre-clean chamber of the tool configuration of FIG. 1) may perform one or more pre-cleaning operations to remove oxide layers from sidewalls and bottoms of a first trench formed on a metal gate and a second trench formed on an epitaxial layer of the semiconductor device, as described above in connection with reference number 205 of FIG. 2A. In some implementations, removal of the oxide layers causes a fluorine residual layer to form on the metal gate. The first trench formed on the metal gate and the second trench formed on the epitaxial layer may each include a width in a range from approximately twenty-two nanometers to approximately twenty-four nanometers, and an aspect ratio in a range from approximately two to approximately four.

As further shown in FIG. 5, process 500 may include performing an in-situ high temperature degas operation, at a temperature of greater than or equal to three-hundred degrees Celsius, to remove the fluorine residual layer formed on the metal gate (block 520). For example, the tool configuration (e.g., the degas chamber of the tool configuration of FIG. 1) may perform an in-situ high temperature degas operation, at a temperature of greater than or equal to three-hundred degrees Celsius, to remove the fluorine residual layer formed on the metal gate, as described above in connection with reference number 210 of FIG. 2B.

As further shown in FIG. 5, process 500 may include performing one or more titanium deposition operations to form titanium layers on the sidewalls and the bottoms of the first trench and the second trench and to cause a silicide layer to form on the epitaxial layer (block 530). For example, the tool configuration may perform one or more titanium deposition operations to form titanium layers on the sidewalls and the bottoms of the first trench and the second trench and to cause a silicide layer to form on the epitaxial layer, as described above in connection with reference numbers 215 and 220 of FIGS. 2C and 2D.

As further shown in FIG. 5, process 500 may include performing one or more photoresist, etching, or deposition operations to form a metal layer in the first trench and the second trench and on top of the titanium layers formed on the bottoms of the first trench and the second trench, wherein the metal layer creates a first layer over the metal gate and creates a second layer over the epitaxial layer (block 540). For example, the tool configuration may perform one or more photoresist, etching, or deposition operations to form a metal layer in the first trench and the second trench and on top of the titanium layers formed on the bottoms of the first trench and the second trench, as described above in connection with reference numbers 225-234 of FIGS. 2E-2H. In some implementations, the metal layer creates a first layer over the metal gate and creates a second layer over the epitaxial layer.

As further shown in FIG. 5, process 500 may include performing a dielectric deposition operation to form a dielectric layer on the first layer and the second layer (block 550). For example, the tool configuration may perform a dielectric deposition operation to form a dielectric layer on the first layer and the second layer, as described above in connection with reference number 250 of FIG. 2J.

As further shown in FIG. 5, process 500 may include performing photoresist and etching operations to create a first via in the dielectric layer formed on the first layer and to create a second via in the dielectric layer formed on the second layer (block 560). For example, the tool configuration may perform photoresist and etching operations to create a first via in the dielectric layer formed on the first layer and to create a second via in the dielectric layer formed on the second layer, as described above in connection with reference number 225 of FIG. 2K. The first via and the second via may each include a width in a range from approximately fourteen nanometers to approximately twenty-two nanometers, and an aspect ratio in a range from approximately one to approximately two.

As further shown in FIG. 5, process 500 may include performing tungsten deposition and planarization operations to fill the first via with tungsten and to form a first filled via on the first layer (block 570). For example, the tool configuration may perform tungsten deposition and planarization operations to fill the first via with tungsten and to form a first filled via on the first layer, as described above in connection with reference numbers 260 and 265 of FIGS. 2L and 2M.

As further shown in FIG. 5, process 500 may include performing the tungsten deposition and planarization operations to fill the second via with tungsten to form a second filled via on the second layer (block 580). For example, the tool configuration may perform the tungsten deposition and planarization operations to fill the second via with tungsten to form a second filled via on the second layer, as described above in connection with reference numbers 260 and 265 of FIGS. 2L and 2M.

As further shown in FIG. 5, process 500 may include performing one or more back end of the line operations to form a metal layer on the dielectric layer, the first filled via, and the second filled via (block 590). For example, the tool configuration may perform one or more back end of the line operations to form a metal layer on the dielectric layer, the first filled via, and the second filled via, as described above.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

In this way, an in-situ high-temperature anneal process may be performed using an in-situ high-temperature degas chamber to remove a fluorine residual layer on a metal gate of a semiconductor device. The in-situ high-temperature anneal process may include using the in-situ high-temperature degas chamber to heat the semiconductor device, which causes the fluorine residual layer to decompose and transition to a gas or vapor. The in-situ high-temperature anneal process may include generating a vacuum in the in-situ high temperature degas chamber and using the vacuum to remove the gaseous or vaporized fluorine residual layer from the in-situ high temperature degas chamber. An MP layer may be formed over the metal gate after the in-situ high-temperature anneal process. In this way, the method for manufacturing a semiconductor device provides a fluorine-free interface between the MP layer and the metal gate, which reduces contact resistance, reduces metal resistance, and improves performance of the semiconductor device.

As described in greater detail above, some implementations described herein provide a method for manufacturing a semiconductor device. The method may include removing oxide layers from sidewalls and bottoms of trenches formed on a metal gate and formed on an epitaxial source/drain of the semiconductor device, where removal of the oxide layers causes a fluorine residual layer to form on the metal gate. The method may include removing the fluorine residual layer formed on the metal gate, and forming titanium or titanium nitride layers on the sidewalls and the bottoms of the trenches to cause a silicide layer to form on the epitaxial source/drain. The method may include forming a metal layer in the trenches and on top of the titanium or titanium nitride layers formed on the bottoms of the trenches, where the metal layer creates an MP layer over the metal gate and creates an MD layer over the epitaxial source/drain. The method may include forming a dielectric layer on the MP layer and the MD layer, and removing portions of the dielectric layer to create a first via in the dielectric layer on the MP layer and to create a second via in the dielectric layer on the MD layer. The method may include filling the first via with a material to form a first filled via on the MP layer, and filling the second via with the material to form a second filled via on the MD layer.

As described in greater detail above, some implementations described herein provide a method for manufacturing a semiconductor device. The method may include performing one or more pre-cleaning operations to remove oxide layers from sidewalls and bottoms of a first trench formed on a metal gate and a second trench formed on an epitaxial layer of the semiconductor device, where removal of the oxide layers causes a fluorine residual layer to form on the metal gate. The method may include performing an in-situ high temperature degas operation, at a temperature of greater than or equal to three-hundred degrees Celsius, to remove the fluorine residual layer formed on the metal gate, and performing one or more titanium deposition operations to form titanium layers on the sidewalls and the bottoms of the first trench and the second trench and to cause a silicide layer to form on the epitaxial layer. The method may include performing one or more photoresist, etching, or deposition operations to form a metal layer in the first trench and the second trench and on top of the titanium layers formed on the bottoms of the first trench and the second trench, where the metal layer creates a first layer over the metal gate and creates a second layer over the epitaxial layer. The method may include performing a dielectric deposition operation to form a dielectric layer on the first layer and the second layer, and performing photoresist and etching operations to create a first via in the dielectric layer formed on the first layer and to create a second via in the dielectric layer formed on the second layer. The method may include performing tungsten deposition and planarization operations to fill the first via with tungsten and to form a first filled via on the first layer, and performing the tungsten deposition and planarization operations to fill the second via with tungsten to form a second filled via on the second layer. The method may include performing one or more back end of the line operations to form a metal layer on the dielectric layer, the first filled via, and the second filled via.

As described in greater detail above, some implementations described herein provide a semiconductor device that may include an active region, an epitaxial source/drain formed in and extending above the active region, and a first dielectric layer formed over a portion of the active region. The semiconductor device may include a first metal gate and a second metal gate formed in the first dielectric layer, a second dielectric layer formed over the first dielectric layer and the second metal gate, and a titanium layer formed on the metal gate and on the epitaxial source/drain. The titanium layer may be formed on the first metal gate without an intervening fluorine residual layer, and the titanium layer may be formed on the epitaxial source/drain with an intervening silicide layer. The semiconductor device may include a first metal layer formed on top of the titanium layer formed on the first metal gate, a second metal layer formed on top of the titanium layer formed on the epitaxial source/drain, and a third dielectric layer formed on the second dielectric layer. The semiconductor device may include a first via, in the third dielectric layer, filled with a material, and a second via, in the third dielectric layer, filled with the material. The semiconductor device may include a metal layer formed on the third dielectric layer, the first via, and the second via, and a fourth dielectric layer formed on portions of the metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A method for manufacturing a semiconductor device, the method comprising:
   removing oxide layers from sidewalls and bottoms of trenches formed on a metal gate and formed on an epitaxial source/drain of the semiconductor device,
      wherein removal of the oxide layers causes a fluorine residual layer to form on the metal gate;
   removing the fluorine residual layer formed on the metal gate;
   forming titanium or titanium nitride layers on the sidewalls and the bottoms of the trenches to cause a silicide layer to form on the epitaxial source/drain;
   forming a metal layer in the trenches and on top of the titanium or titanium nitride layers formed on the bottoms of the trenches, wherein the metal layer creates a metal on poly (MP) layer over the metal gate and creates a metal on an operation domain (MD) layer over the epitaxial source/drain;

forming a dielectric layer on the MP layer and the MD layer;

removing portions of the dielectric layer to create a first via in the dielectric layer on the MP layer and to create a second via in the dielectric layer on the MD layer;

filling the first via with a material to form a first filled via on the MP layer; and filling the second via with the material to form a second filled via on the MD layer.

2. The method of claim 1, wherein removing the fluorine residual layer comprises:

processing the semiconductor device with an in-situ high temperature degas chamber that removes the fluorine residual layer formed on the metal gate due to a vacuum used by the in-situ high temperature degas chamber.

3. The method of claim 2, wherein the in-situ high temperature degas chamber operates at a temperature of greater than or equal to three-hundred degrees Celsius.

4. The method of claim 2, wherein the in-situ high temperature degas chamber performs one of atomic layer deposition, physical vapor deposition, chemical vapor deposition, or annealing on the semiconductor device to remove the fluorine residual layer formed on the metal gate.

5. The method of claim 1, wherein the MD layer comprises one of:
 a cobalt material,
 a ruthenium material,
 an iridium material, or
 a molybdenum material.

6. The method of claim 1, wherein the metal gate comprises a gap fill from one of:
 a tungsten material,
 a cobalt material,
 a ruthenium material, or
 an iridium material.

7. The method of claim 1, wherein the material to form the first filled via and the second filled via comprises one of:
 a tungsten material,
 a ruthenium material,
 an iridium material, or
 a molybdenum material.

8. The method of claim 1, further comprising:
 forming a metal layer on the dielectric layer, the first filled via, and the second filled via.

9. The method of claim 1, wherein the silicide layer comprises one of:
 a titanium silicide layer,
 a nickel silicide layer,
 a cobalt silicide layer, or
 a platinum silicide layer.

10. The method of claim 1, wherein the trenches include a first trench formed on the metal gate and a second trench formed on the epitaxial source/drain,
 wherein the first trench and the second trench each includes:
  a width in a range from approximately twenty-two nanometers to approximately twenty-four nanometers, and
  an aspect ratio in a range from approximately two to approximately four.

11. The method of claim 1, wherein the first via and the second via each includes:
 a width in a range from approximately fourteen nanometers to approximately twenty-two nanometers, and
 an aspect ratio in a range from approximately one to approximately two.

12. The method of claim 1, wherein the titanium or titanium nitride layers include one of:
 a thickness in a range from approximately eighty angstroms to approximately two-hundred angstroms when the titanium or titanium nitride layers include only titanium, or
 a thickness in a range from approximately twenty angstroms to approximately forty angstroms when the titanium or titanium nitride layers include only titanium nitride.

13. The method of claim 1, wherein the first filled via is provided on top of and contacts the MP layer, and the MP layer is provided on top of the metal gate.

14. The method of claim 1, wherein forming the metal layer in the trenches comprises:
 performing an electrochemical plating operation to form the metal layer in the trenches.

15. The method of claim 1, wherein, when the material is tungsten, filling the first via with the material to form the first filled via comprises:
 forming a metal organic tungsten layer in the first via,
 depositing an atomic layer of tungsten on the metal organic tungsten layer in the first via, and
 performing a chemical vapor deposition operation to fill the first via with tungsten provided on the atomic layer of tungsten and the metal organic tungsten layer.

16. A non-transitory computer-readable medium storing a set of instructions, the set of instructions comprising:
 one or more instructions that, when executed by one or more processors of a device, cause the device to:
  remove oxide layers from sidewalls and bottoms of trenches formed on a metal gate and formed on an epitaxial source/drain of a semiconductor device,
   wherein removal of the oxide layers causes a fluorine residual layer to form on the metal gate;
  remove the fluorine residual layer formed on the metal gate;
  form titanium or titanium nitride layers on the sidewalls and the bottoms of the trenches to cause a silicide layer to form on the epitaxial source/drain;
  form a metal layer in the trenches and on top of the titanium or titanium nitride layers formed on the bottoms of the trenches,
   wherein the metal layer creates a metal on poly (MP) layer over the metal gate and creates a metal on an operation domain (MD) layer over the epitaxial source/drain;
  form a dielectric layer on the MP layer and the MD layer;
  remove portions of the dielectric layer to create a first via in the dielectric layer on the MP layer and to create a second via in the dielectric layer on the MD layer;
  fill the first via with a material to form a first filled via on the MP layer; and
  fill the second via with the material to form a second filled via on the MD layer.

17. The non-transitory computer-readable medium of claim 16, wherein the one or more instructions, that cause the device to remove the fluorine residual layer, cause the device to:
 process the semiconductor device with an in-situ high temperature degas chamber that removes the fluorine residual layer formed on the metal gate due to a vacuum used by the in-situ high temperature degas chamber.

18. The non-transitory computer-readable medium of claim 17, wherein the in-situ high temperature degas chamber operates at a temperature of greater than or equal to three-hundred degrees Celsius.

19. The non-transitory computer-readable medium of claim 17, wherein the in-situ high temperature degas chamber performs one of atomic layer deposition, physical vapor deposition, chemical vapor deposition, or annealing on the semiconductor device to remove the fluorine residual layer formed on the metal gate.

20. The non-transitory computer-readable medium of claim 16, wherein the trenches include a first trench formed on the metal gate and a second trench formed on the epitaxial source/drain,
  wherein the first trench and the second trench each includes:
    a width in a range from approximately twenty-two nanometers to approximately twenty-four nanometers, and
    an aspect ratio in a range from approximately two to approximately four,
  wherein the first trench and the second trench each includes:
    a width in a range from approximately twenty-two nanometers to approximately twenty-four nanometers, and
    an aspect ratio in a range from approximately two to approximately four.

* * * * *